(12) United States Patent
Yamada et al.

(10) Patent No.: US 11,852,472 B2
(45) Date of Patent: Dec. 26, 2023

(54) OUTPUT SIGNAL PROCESSING CIRCUIT FOR EDDY CURRENT SENSOR AND OUTPUT SIGNAL PROCESSING METHOD FOR EDDY CURRENT SENSOR

(71) Applicant: EBARA CORPORATION, Tokyo (JP)

(72) Inventors: Hiroto Yamada, Tokyo (JP); Taro Takahashi, Tokyo (JP); Hiroaki Shibue, Tokyo (JP); Atsushi Abe, Tokyo (JP); Shinpei Tokunaga, Tokyo (JP)

(73) Assignee: EBARA CORPORATION, Tokyo (JP)

(*) Notice: Subject to any disclaimer, the term of this patent is extended or adjusted under 35 U.S.C. 154(b) by 367 days.

(21) Appl. No.: 17/122,301

(22) Filed: Dec. 15, 2020

(65) Prior Publication Data
US 2021/0199415 A1 Jul. 1, 2021

(30) Foreign Application Priority Data

Dec. 16, 2019 (JP) .................................. 2019-226547
Dec. 16, 2019 (JP) .................................. 2019-226549

(51) Int. Cl.
*G01B 7/06* (2006.01)
*H01L 21/67* (2006.01)

(52) U.S. Cl.
CPC ........ *G01B 7/105* (2013.01); *H01L 21/67253* (2013.01)

(58) Field of Classification Search
CPC . G01B 7/105; H01L 21/67253; B24B 37/107; B24B 49/105; B24B 37/013
See application file for complete search history.

(56) References Cited

U.S. PATENT DOCUMENTS

| | | | |
|---|---|---|---|
| 6,433,541 B1* | 8/2002 | Lehman | G01N 27/72 324/207.16 |
| 2008/0139149 A1* | 6/2008 | Mu | H03D 7/1466 455/200.1 |
| 2010/0035516 A1 | 2/2010 | Takahashi et al. | |
| 2018/0340987 A1* | 11/2018 | Latham | G01R 33/032 |
| 2019/0193242 A1 | 6/2019 | Takahashi et al. | |
| 2020/0103493 A1* | 4/2020 | Wang | G01S 7/415 |
| 2021/0022610 A1* | 1/2021 | Domnich | A61B 5/6862 |

FOREIGN PATENT DOCUMENTS

| | | |
|---|---|---|
| JP | 2007-532872 A | 11/2007 |
| JP | 2010-175530 A | 8/2010 |
| JP | 2011-023579 A | 2/2011 |
| JP | 2013-068465 A | 4/2013 |
| WO | 2005-013340 A1 | 2/2005 |
| WO | 2005/098370 A1 | 10/2005 |

* cited by examiner

Primary Examiner — Christopher P McAndrew
Assistant Examiner — Zannatul Ferdous
(74) Attorney, Agent, or Firm — PEARNE & GORDON LLP

(57) ABSTRACT

An eddy current sensor assembly includes an eddy current sensor and an output signal processing circuit that processes an output signal from the eddy current sensor. The output signal processing circuit includes a mixer circuit that accepts the output signal and a signal of the predetermined frequency as input, multiplies the two signals received as input, and outputs an output signal obtained by the multiplication, and a low-pass filter that accepts the output signal output by the mixer circuit as input, cuts a high-frequency signal included in the output signal received as input, and outputs at least a direct-current (DC) signal.

6 Claims, 20 Drawing Sheets

OUTPUT SIGNAL PROCESSING CIRCUIT FOR EDDY CURRENT SENSOR AND OUTPUT SIGNAL PROCESSING METHOD FOR EDDY CURRENT SENSOR

TECHNICAL FIELD

The present invention relates to a circuit and a method for processing an output signal from an eddy current sensor.

BACKGROUND ART

Eddy current, sensors are used for applications such as Mm thickness measurement and displacement measurement. Hereinafter, film thickness measurement will be taken as an example to describe an eddy current sensor. An eddy current sensor for film thickness measurement is used in a semiconductor device fabrication step (polishing step), for example. In the polishing step, the eddy current sensor is used as follows. As the level of integration in semiconductor devices advances, circuit interconnects are becoming finer, and the spacing between interconnects is becoming narrower. Accordingly, it is necessary to planarize the surface of a semi conductor wafer, which is a polishing target. It is therefore a common practice to polish the wafer by a polishing apparatus as a way of planarization.

A polishing apparatus is provided with a polishing table for holding a polishing pad for polishing the polishing target and a top ring for holding and pressing the polishing target against the polishing pad. The polishing table and the top ring are each rotated by a driving unit (a motor, for example). A liquid containing: a polishing agent (slurry) is made to flow onto the polishing pad, and by pressing the polishing target held by the top ring against the polishing pad, the polishing target is polished.

If the polishing of the polishing target by the polishing apparatus is insufficient, circuits will not be insulated front each other, possibly leading to a short circuit. On the other hand, other problems may occur if the polishing target is over-polished, such as a rise in resistance values because of a decrease in the cross-sectional area of the wiring, or the wiring itself may be completely removed and the circuit itself may not be formed. Consequently, there is a demand to detect an optimal polishing endpoint in a polishing apparatus.

Such technology is described in Japanese Patent Laid-Open No. 2011-23579. In this technology, an eddy current sensor using three coils is used to detect a polishing endpoint. As illustrated in FIG. 5 of Japanese Patent Laid-Open No. 2011-23579, among the three coils, a detecting coil and a dummy coil form a series circuit, both ends of which are connected to a resistance bridge circuit including a variable resistance. By adjusting the balance with the resistance bridge circuit, it is possible to adjust the zero point such that, the output of the resistance bridge circuit goes to zero when the film thickness is zero. The output of the resistance bridge circuit is input into a synchronous detector circuit, as illustrated in FIG. 6 of Japanese Patent Laid-Open No. 2011-23579. The synchronous detector circuit extracts a resistance component. (R), a reactance component (X), an amplitude output (Z), and a phase output ($\tan^{-1}$R/X) associated with changes in the film thickness from the input signal. With regard to a detection method using a bridge circuit of the related art, the magnitude of adjustment to the resistance value when adjusting the zero point is extremely small, compared to the magnitude of the entire resistance value forming the bridge circuit. As a result, the magnitude of a temperature change in the entire resistance value is non-negligible compared to the magnitude of the resistance value adjustment when adjusting the zero point. Because of change, in the resistance value due to temperature change, change in the stray capacitance of the resistance, and the tike, the properties of the bridge circuit are highly susceptible to the influence of changes in the surrounding resistance environment. As a result, there is a problem in that the zero point described above shifts easily, and the accuracy of measuring the film thickness fails.

Also, with regard to the method of measuring the film thickness using an eddy current sensor of the related art, the signal output by the eddy current sensor is noisy. For this reason, when detecting tiny interconnects (Cu interconnects, for example), the output signal itself is small, and in some cases the output signal is buried in the noise and the film thickness cannot be measured. Additionally, in the cases where the magnitude of the output signal is somewhat larger than, the noise, the film thickness is measurable, but there is still the problem of low accuracy of the film thickness measurement.

CITATION LIST

Patent Literature

PTL 1: Japanese Patent Laid-Open No. 2011-23579

SUMMARY OF THE INVENTION

Technical Problem

One aspect of the present invention has been devised in order to address such issues, and an object thereof is to provide a circuit and a method for processing an output signal from an eddy current sensor that is less susceptible to the influence of changes in the surrounding environment compared to the related art.

Another aspect of the present invention has been devised in order to address other issues, and an object thereof is to provide a circuit and a method for processing an output signal from an eddy current sensor in which the signal-to-noise ratio (S/N) is improved over the related technology.

Solution to Problem

To address the above problems, Aspect 1 adopts a configuration of an eddy-current sensor assembly comprising: an eddy current sensor; and an output signal processing circuit, that processes an output signal of the eddy current sensor, wherein the output signal processing circuit includes a mixer circuit that accepts the output signal and a signal of a predetermined frequency as input, multiplies the two input signals, and outputs an output signal obtained by the multiplication, and a low-pass filter that accepts the output signal output by the mixer circuit as input, cuts a high-frequency signal included in the output signal received as input, and outputs at least a direct-current (DC) signal.

Aspect 2 adopts a configuration of an eddy current sensor output signal processing circuit that processes first and second output signals output by an eddy current sensor including first and second coils that respectively output the first and second output signals, the output signal processing circuit comprising: a first mixer circuit that accepts the first, output signal and a signal of a predetermined frequency as input, multiplies the two input signals, and outputs an output signal obtained by the multiplication; a first low-pass filter that accepts the output signal output by the first mixer circuit as input, cuts a high-frequency signal included in the output signal received as input, and outputs at least a DC signal; a second mixer circuit that accepts the second output signal and the signal of the predetermined frequency as input, multiplies the two input signals, and outputs an output signal obtained by the multiplication; a second low-pass filter that accepts the output signal output by the second mixer circuit as input, cuts a high-frequency signal included in the output signal received as input, and outputs at least a DC signal; and a first subtractor circuit that accepts the DC signal output by the first low-pass filter and the DC signal output by the second low-pass filter as input, obtains a difference between the two input DC signals, and outputs the obtained difference.

Aspect 3 adopts a configuration of the eddy current sensor output signal processing circuit according to Aspect 2, wherein the output signal processing circuit includes a first adjustment circuit that accepts the DC signal output by the first low-pass filter as input, adjusts a magnitude of an amplitude of the input DC signal, and outputs an adjusted DC signal, and the first subtractor circuit accepts the DC signal output by the first adjustment circuit and the DC signal output by the second low-pass filter as input, obtains a difference between the two input DC signals, and outputs the obtained difference.

Aspect 4 adopts a configuration of the eddy current sensor output signal processing circuit according to Aspect 2, wherein the output signal processing circuit, includes a first adjustment-circuit that accepts the DC signal output by the first low-pass filter as input, adjusts a magnitude of an amplitude of the input DC signal, and outputs an adjusted. DC signal, and a second adjustment circuit that accepts the DC signal output by the second low-pass filter as input, adjusts a magnitude of an amplitude of the input DC signal, and outputs an adjusted DC signal, and the first subtractor circuit accepts the DC signal output by the first adjustment circuit and the DC signal output by the second adjustment circuit as input, obtains a difference between the two input. DC signals, and outputs the obtained difference.

Aspect 5 adopts a configuration of the eddy current sensor output signal processing circuit according to any one of Aspects 2 to 4, wherein the eddy current sensor includes third and fourth coils that respectively output third and fourth output signals, and the output signal processing circuit includes a third mixer circuit that accepts the third output signal and the signal of the predetermined frequency as input, multiplies the two input signals, and outputs an output signal obtained by the multiplication, a third low-pass filter that accepts the output signal output by the third mixer circuit as input, cuts a high-frequency signal included in the output signal received as input, and outputs at least a DC signal a fourth mixer circuit that accepts the fourth output signal and the signal of the predetermined, frequency as input, multiplies the two input signals, and outputs an output signal obtained by the multiplication, a fourth low-pass filter that, accepts the output, signal output, by the fourth mixer circuit as input, cuts a high-frequency signal included in the output signal received as input, and outputs at least a DC signal, a second subtracter circuit that accepts the DC signal output by the third low-pass filter and the DC signal output by the fourth low-pass filter as input, obtains a difference between the two input DC signals, and outputs the obtained difference, and an adder circuit that accepts the difference output by the first subtracter circuit and the difference output by the second subtractor circuit as input, obtains a sum of the two input differences or a difference between the two input differences, and outputs the obtained sum or difference.

Aspect 6 adopts a configuration of an eddy current sensor output signal processing method comprising: inputting an output, signal of an eddy current sensor and a signal of a predetermined frequency into a mixer circuit, multiplying the two input signals with the mixer circuit, and outputting an output signal obtained by the multiplication, and inputting the output signal output by the mixer circuit into a low-pass filter, cutting a high-frequency signal, and outputting at least a DC signal.

Aspect 7 adopts a configuration of an eddy current sensor output signal processing method that, processes first and second output signals output by an eddy current sensor including first and second coils thru respectively output first and second output signals, the output signal processing method comprising: inputting the first output signal and a signal of a predetermined frequency into a first mixer circuit, multiplying the two input signals with the first mixer circuit and outputting an output signal obtained by the multiplication; inputting the output signal output by the first mixer circuit into a first low-pass filter, cutting a high-frequency signal included in the output signal with the first low-pass filter, and outputting at least a DC signal; inputting the second output signal and the signal of the predetermined-frequency into a second mixer circuit, multiplying the two input signals with the second mixer circuit, and outputting an output signal obtained by the multiplication; inputting the output signal output by the second mixer circuit into a second low-pass filter, cutting a high-frequency signal included in the output signal with the second low-pass filter, and outputting at least a DC signal; and inputting the DC signal output by the first low-pass filter and the DC signal output by the second low-pass filter into a first subtractor circuit, obtaining a difference between the two input DC signals with the first subtractor circuit, and outputting the obtained difference.

Aspect 8 adopts a configuration of an eddy current sensor output signal processing method wherein the eddy current sensor includes third and fourth coils that respectively output third and fourth output signals, and the output signal processing method comprises; inputting the third output signal and the signal of the predetermined frequency into a third mixer circuit, multiplying the two input signals with the third mixer circuit, and outputting an output signal obtained by the multiplication; inputting the output signal of the third mixer circuit into a third low-pass filter, cutting a high-frequency signal included in the output signal with the third low-pass filter, and outputting at least a DC signal; inputting the fourth output signal and the signal of the predetermined frequency into a fourth mixer circuit, multiplying the two input signals with the fourth mixer circuit, and outputting an output signal obtained by the multiplication; inputting the output signal of the fourth mixer circuit into a fourth, low-pass filter, cutting a high-frequency signal included in the output signal with the fourth low-pass filter, and outputting at least a DC signal; inputting the DC signal output by the third low-pass filter and the DC signal output by the fourth low-pass filter into a second subtractor circuit, obtaining a difference between the two input DC signals with the second subtractor circuit, and outputting the obtained difference; and inputting the difference output by the first subtracter circuit and the difference output by the second subtractor circuit into an adder circuit, obtaining a sum of the two differences or a difference between the two differences with the adder circuit, and outputting the obtained sum or difference.

Aspect 9 adopts a configuration of a polishing apparatus comprising: a polishing table to which a polishing pad is attached for polishing a substrate; a driving unit configured to rotationally drive the polishing table; a holding unit configured to hold the substrate and press the substrate against the polishing pad; the eddy current sensor disposed inside the polishing table and configured to detect an eddy current formed in a conductive film formed on the substrate in association with the rotation of the polishing table; the eddy current sensor output signal processing circuit according to any one of Aspects 2 to 5; and an endpoint detection controller configured to compute film thickness data about the substrate from the output of the output signal processing circuit.

To address the above problems, Aspect 10 adopts a configuration of an eddy current sensor assembly comprising: an eddy current sensor including an exciting coil capable of accepting an excitation, signal and generating a magnetic field, and a detecting coil capable of detecting the magnetic field and outputting a detection signal; and an output signal processing circuit that processes the detection signal, wherein the output signal processing circuit includes a generator circuit capable of generating a noise reduction signal for reducing noise from the excitation signal or the detection signal, and an adder circuit capable of adding the noise reduction signal generated in the generator circuit to the detection signal to generate a noise-reduced signal in which noise included in the detection signal is reduced.

Aspect 11 adopts a configuration of an eddy current sensor output signal processing circuit that processes a first detection signal and a first dummy signal output by as eddy current sensor including a first exciting coil capable of accepting an excitation signal as input and generating a first magnetic field, a first detecting coil capable of detecting the first magnetic field and outputting the first detection signal, and a first dummy coil capable of detecting the first magnetic field and outputting the first dummy signal, the output signal processing circuit comprising: a first resistance bridge circuit capable of outputting a difference between the first detection, signal and the first dummy signal as a first difference signal; a first generator circuit capable of generating a first noise reduction signal for reducing noise from any of the excitation signal, the first detection signal, the first dummy signal and the first difference signal; and a first adder circuit capable of adding the first noise reduction signal generated in the first generator circuit to the first difference signal to generate a first noise-reduced signal in which noise included in the first difference signal is reduced.

Aspect 12 adopts a configuration of the eddy current sensor output signal processing circuit according to Aspect 11, wherein the eddy current sensor includes a second exerting coil capable of accepting the excitation signal as input and generating a second magnetic field, a second detecting coil capable of detecting the first magnetic field and the second magnetic field, and outputting a second defection signal, and a second dummy coil capable of detecting the first magnetic field and the second magnetic field, and outputting a second dummy signal, the first detecting coil is capable of detecting the first magnetic field and the second magnetic field to output the first detection signal the first dummy coil is capable of detecting the first magnetic field and the second magnetic field to output the first dummy signal, and the output signal processing circuit, includes a second resistance bridge circuit capable of outputting a difference between the second detection signal and the second dummy signal as a second difference signal, a second generator circuit capable of generating a second noise reduction signal for reducing noise from any of the excitation signal, the second detection signal the second dummy signal, and the second difference signal, a second adder circuit capable of adding the second noise reduction signal generated in the second generator circuit to the second difference signal to generate a second noise-reduced signal in which noise included, in the second difference signal, is reduced, and a third adder circuit capable of adding together the first noise-reduced signal and the second noise-reduced signal.

Aspect 13 adopts a configuration of an eddy current, sensor output signal processing circuit that processes first and second detection signals and first and second dummy signals output by an eddy current sensor including first and second exciting coils capable of accepting an excitation signal as input and respectively generating first and second magnetic fields, first and second detecting coils capable of detecting the first magnetic field and the second magnetic field, and respectively outputting the first and second detection signals, and first and second dummy coils capable of detecting the first magnetic field and the second magnetic field, and respectively outputting the first and second dummy signals, the output signal processing circuit comprising: a first resistance bridge circuit capable of outputting a difference between the first detection signal and the first dummy signal, as a first difference signal; a second resistance bridge circuit capable of outputting a difference between the second detection signal and the second dummy signal as a second difference signal, a third adder circuit capable of adding together the first difference signal and the second difference signal.

Aspect 14 adopts a configuration of an eddy current sensor output si goal processing method that processes a detection signal output by an eddy current sensor including an exciting coil capable of accepting an excitation signal as input and generating a magnetic field, and a detecting coil capable of detecting the magnetic field and generating the detection signal, the output signal processing method comprising: generating a noise reduction signal for reducing noise from the excitation signal or the detection signal; and adding the generated noise reduction signal to the detection signal to generate a noise-reduced signal in which noise included, in the detection signal is reduced.

Aspect 15 adopts a configuration of an eddy current sensor output signal processing method that processes a first detection signal and a first dummy signal output by an eddy current sensor including a first exciting coil capable of accepting an excitation signal as input and generating a first magnetic field, a first detecting coil capable of detecting the first magnetic field and outputting the first detection, signal, and a first dummy coil capable of detecting the first magnetic field and outputting the first dummy signal, the output signal processing method comprising: outputting a difference between the first detection, signal and the first dummy signal as a first difference signal; generating a first noise reduction signal for reducing noise from any of the excitation signal, the first detection signal, the first dummy signal, and the first difference signal; and adding the generated first noise reduction signal to the first difference signal to generate a first noise-reduced signal in which noise included in the first difference signal is reduced.

Aspect 16 adopts a configuration of the eddy current sensor output signal processing method according to Aspect 15, wherein the eddy current sensor includes a second exciting coil capable of accepting the excitation signal as input and generating a second magnetic field, a second detecting coil capable of detecting the first magnetic field and the second magnetic Held, and outputting a second detection signal, and a second dummy coil capable of detecting the first magnetic field and the second magnetic field, and outputting a second dummy signal, the first detecting coil is capable of detecting the first magnetic field and the second magnetic field to output the first detection signal, the first dummy coil is capable of detecting the first magnetic field and the second magnetic field to output the first dummy signal, and the output signal processing method comprises: outputting a difference between the second detection signal and the second dummy signal as a second difference signal; generating a second noise reduction signal for reducing noise from any of the excitation signal, the second detection signal, the second dummy signal, and the second difference signal; adding the generated second noise reduction signal to the second difference signal to generate a second noise-reduced signal in which noise included in the second difference signal is reduced; and adding together the first noise-reduced signal and the second noise-reduced signal.

Aspect 17 adopts a configuration of an eddy current sensor output signal processing method that processes first and second detection signals and first and second dummy signals output by an eddy current sensor including first and second exciting coils capable of accepting an excitation, signal as input and respectively generating first and second magnetic fields, first and second detecting coils capable of detecting the first magnetic field and the second magnetic field, and respectively outputting the first and second detection, signals, and first and second dummy coils capable of detecting the first magnetic field and the second magnetic field, and respectively outputting the first and second dummy signals, the output signal processing method comprising: outputting a difference between the first detection signal and the first dummy signal as a first difference signal; outputting a difference between the second detection signal and the second dummy signal as a second difference signal; adding together the first difference signal and the second difference signal.

DESCRIPTION OF EMBODIMENTS

Figure 1:
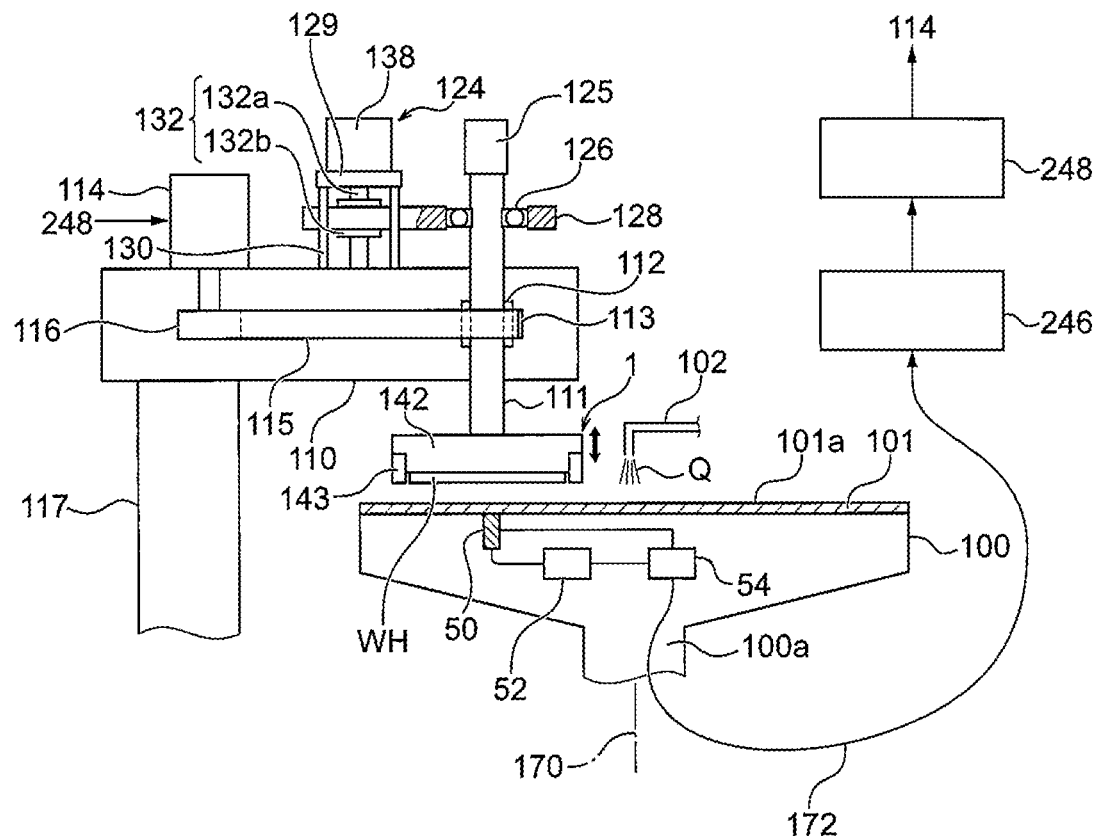
FIG. 1 is a schematic diagram illustrating an overall configuration of a polishing apparatus according to an embodiment of the present invention.

Hereinafter, embodiments of the present invention will be described with reference to the drawings. Note that in the following embodiments, identical or corresponding members are denoted with the same signs, and a duplicate description may be omitted. Also, features indicated in each embodiment are also applicable to other embodiments insofar as the embodiments do not contradict each other, FIG. 1 is a schematic diagram illustrating an overall configuration of a polishing apparatus to which an eddy current sensor 50 according to an embodiment of the present invention is applied. As illustrated in FIG. 1, the polishing apparatus is provided with a polishing table 100 and a top ring (holding unit) 1 that holds a substrate to be polished, such as a semiconductor wafer, against a polishing surface on the polishing table.

The polishing table 100 is coupled to a motor (not illustrated) that acts as a driving unit disposed underneath through a table spindle 100a, and is capable of rotating about the table spindle 100a. A polishing pad 101 is affixed to the top face of the polishing table 100, and the surface 101a of the polishing pad 101 forms a polishing surface that polishes a semiconductor wafer WH. A polishing liquid supply nozzle 102 is installed above the polishing table 100, such that a polishing liquid Q is supplied onto the polishing pad 101 on the polishing table 100 by the polishing liquid supply nozzle 102, As illustrated in FIG. 1, an eddy current sensor 50 is embedded inside the polishing table 100.

The top ring 1 basically includes a top ring body 142 that presses the semiconductor wafer WH against the surface 101a and a retainer ring 143 that holds the peripheral edges of the semiconductor wafer WH such, that the semiconductor wafer WH does not fly off the top sing.

The top ring 1 is connected to a top ring shaft 111, and the top ring shaft 111 is configured to move up and down with respect to a top ring head 110 by a raising/lowering mechanism 124. By the up and down movement of the top ring shaft 111, the entire top ring 1 is raised or lowered and positioned with respect to the top ring head 110. Note that a rotary joint 125 is attached to the top end of the top ring shaft 111.

The raising/lowering mechanism 124 that moves the top ring shaft 111 and the top ring 1 up and down is provided with a bridge 128 that rotatably supports the top ring shaft 111 through a bearing 126, a ball screw 132 attached to the bridge 128, a support stand 129 supported by a support column 130, and a servo motor 138 provided on the support stand 129. The support stand 129 that supports the servo motor 138 is secured to the top ring head 110 through the support column 130.

The ball screw 132 is provided with a screw shaft 132a coupled to the servo motor 138 and a nut 132b with which the screw shaft 132a engages. The top ring shaft 1H is configured to move up and down as one with the bridge 128. Consequently, when the servo motor 138 is driven, the bridge 128 moves up and down through the hall screw 132, thereby causing the top ring shaft 111 and the top ring 1 to move up and down.

Additionally, the top ring shaft 111 is coupled to a rotating cylinder 112 through a key (not illustrated). The rotating cylinder 112 is provided with a timing pulley 113 on the outer periphery thereof. A top ring motor 114 is secured to the top ring head 110, and the timing pulley 113 is connected to a timing pulley 116 provided in the top ring motor 114 through the timing belt 115, Consequently, by rotationally driving the top ring motor 114, the rotating cylinder 112 and the top ring shaft 111 rotate as one through, the timing pulley 116, the timing belt 115, and toe timing pulley 113, and the top ring 1 rotates. Mote that the top nog head 110 is supported by a top ring head shaft 117 rotationally supported by a frame (not illustrated).

Figure 2:
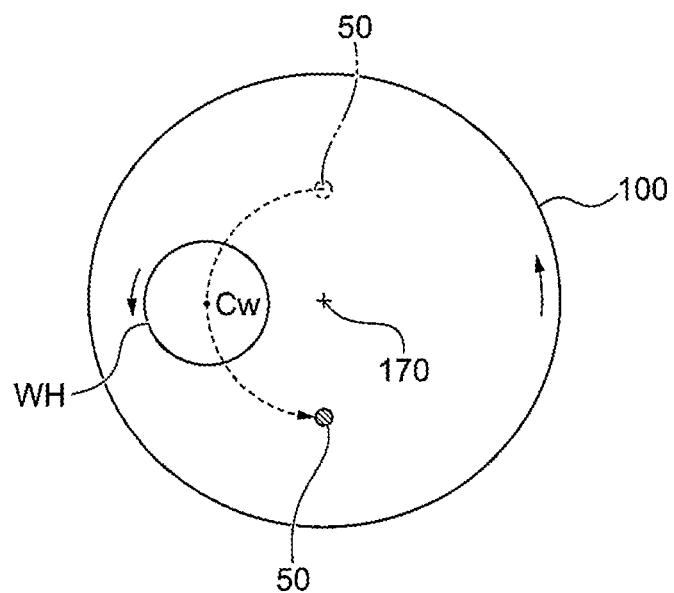
FIG. 2 is a plan view illustrating the relationship among a polishing table, an eddy current sensor, and a semiconductor wafer.

In the polishing apparatus configured as illustrated in FIG. 1, the top ring 1 is capable of holding a substrate such as the semiconductor wafer WH on the bottom face thereof. The top ring head 110 is capable of turning about the top ring head shaft 117, and the turning of the top ring head 110 causes the top ring 1 holding the semiconductor wafer WH on the bottom face to move from a semiconductor wafer WH receiving position to above the polishing table 100. Thereafter, the top ring 1 is lowered to press the semiconductor wafer WH against the surface (polishing surface) 101a of the polishing pad 101. At this time, the top ring 1 and the polishing table 100 are each made to rotate, and the polishing liquid Q is supplied onto the polishing pad 101 from the polishing liquid supply nozzle 102 provided above the polishing table 100, in this way, the surface of the semiconductor wafer WH is polished by causing the semiconductor wafer WH to slide against the polishing surface 101a of the polishing pad 101, FIG. 2 is a plan view illustrating the relationship among the polishing table 100, the eddy current sensor 50, and the semiconductor wafer WH. As illustrated in FIG. 2, the eddy current sensor 50 is installed at a position that passes through the center Cw of the semiconductor wafer WH being polished that is held by the top ring 1. The polishing table 100 rotates about a rotation center 160. For example, the eddy current sensor 50 is capable of detecting a metal film (conductive film) such as a Cu layer of the semiconductor wafer WH continuously on a passage trajectory (scan line) while passing under the semiconductor wafer WH.

Next, the eddy current sensor 50 provided in the polishing apparatus according to the present invention will be described in further detail using the attached drawings.

Figure 3A:
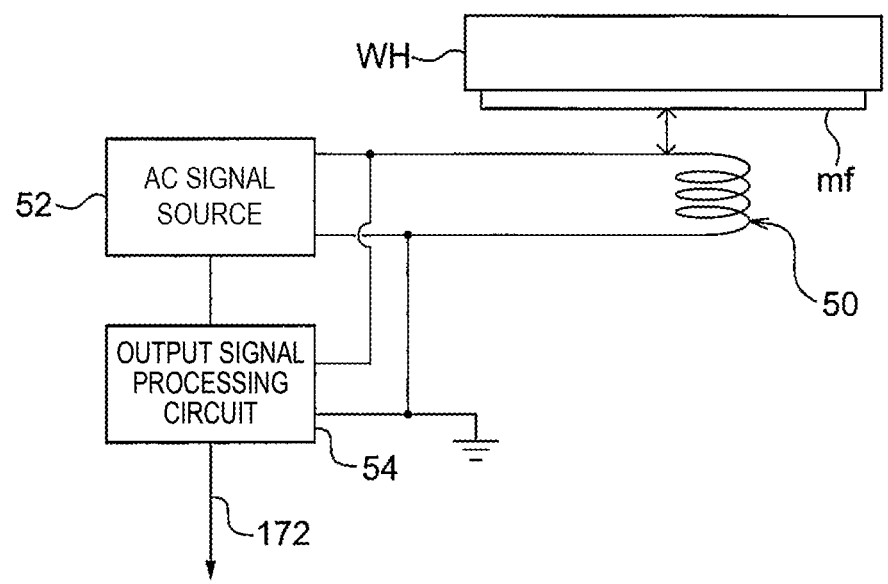
FIG. 3A is a block diagram illustrating a configuration of an eddy current sensor assembly.
Figure 3B:
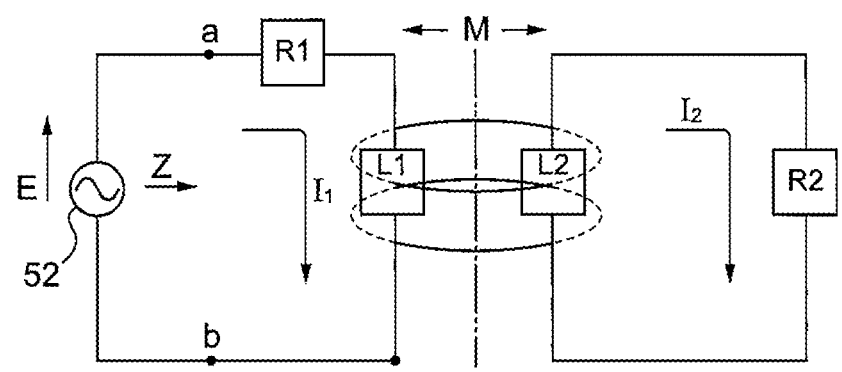
FIG. 3B is an equivalent circuit diagram of the eddy current, sensor assembly.

FIGS. 3A and 3B are diagrams illustrating a configuration of an eddy current sensor assembly including the eddy current sensor 50, in which FIG. 3A is a block diagram illustrating the configuration of the eddy current sensor assembly, and FIG. 3B is an equivalent circuit diagram, of the eddy current sensor assembly. As illustrated in FIG. 3A, the eddy current sensor 50 is disposed near a metal film (or conductive film) mf to be detected, and an alternating-current (AC) signal source 52 is connected to a coil of the eddy current sensor 50. Here, the metal dim (or conductive film) mf to be detected is a thin film of a material such as Cu, Al, Au, or W formed on the semiconductor wafer WH, for example. The eddy current sensor 50 is disposed near the metal film (or conductive film) to be detected at a distance of approximately 1.0 mm to 4.0 mm for example. The coil is normally wound around a magnetic material such as ferrite (not illustrated). The eddy current sensor 50 may also be an air-core coil.

The type of signal detection by the eddy current sensor is referred to as the impedance type, in which an eddy current is generated in the metal film (or conductive film) mf to cause a change in the impedance, and the metal film (or conductive film) is detected from the impedance change. In other words, with, the impedance type, changing the eddy current $I_2$ causes the impedance Z to change in the equivalent circuit illustrated in FIG. 3B, and if the impedance Z as seen from the signal source (a fixed frequency oscillator) 52 changes, the change in the impedance Z can be detected by the output signal processing circuit 54, and a change in the metal film (or conductive film) can be detected.

In an eddy current sensor of the impedance type, it is possible to extract signal outputs X and Y, the phase, and the combined impedance Z (=X+iY). From the impedance components X, Y, and the like, measurement information about the thickness of the metal film (or conductive film) of Cu, Al, Au, or W is obtained. As illustrated in FIG. 3, the eddy current sensor 50 can be built into the polishing table 100 at a position near the surface and positioned to face the semiconductor wafer to be polishing through the polishing pad, such that changes in the metal film (or conductive film) can be detected from an eddy current flowing through the metal film (or conductive film) on the semiconductor wafer.

For the frequency of the eddy current sensor, a single radio wave, AM-modulated radio waves, the sweep output from a function generator, or the like can be used, and it is preferable to select an oscillating frequency and a modulation method with good sensitivity to match the type of metal film.

Hereinafter, an eddy current sensor of the impedance type will be described specifically. The AC signal, source 52 is an oscillator of a fixed frequency approximately from 2 MHz to 3.0 MHz, for which a quartz oscillator is used for example. Additionally, a current $I_1$ flows through the eddy current sensor 50 due to an AC voltage supplied by the AC signal source 52. By causing a current to flow through the eddy current sensor 50 positioned near the metal, film (or conductive film) mf, the magnetic flux links with the metal film (or conductive film) mf to form a mutual inductance M between the two, and an eddy current $I_2$ flows through the metal film (or conductive film) mf Here, R1 is the equivalent resistance on the primary side that includes the eddy current sensor, and L1 is the self-inductance on the primary side that similarly includes the eddy current sensor. On the metal film (or conductive film) mf side, R2 is the equivalent resistance corresponding to eddy current loss, and L2 is the self-inductance thereof. The impedance 2 seen on the eddy current sensor side from terminals a and b of the AC signal source 52 changes depending on the magnitude of the eddy current loss formed, in the metal film (or conductive film) mf.

FIG. 1 also illustrates the output signal processing circuit 54 of the eddy current sensor 50. As illustrated in FIG. 2, the polishing table 100 of the polishing apparatus is capable of rotating about an axis 170, as indicated by the arrow. The AC signal source 52 and the output signal processing circuit 54 are embedded inside the polishing table 100. The eddy current sensor 50 may also be integrated with the AC signal source 52 and the output signal processing circuit 54. An output signal 172 from the output signal processing circuit 54 enters the table spindle 100a of the polishing table 100 and passes through a rotary joint (not illustrated) provided on the axial end of the table spindle $100a_5$ thereby connecting the output signal processing circuit 54 to an endpoint detection controller 246 by the output signal 172. Note that at least one of the AC signal source 52 and the output signal processing circuit 54 may also be disposed outside the polishing table 100.

Figure 4:
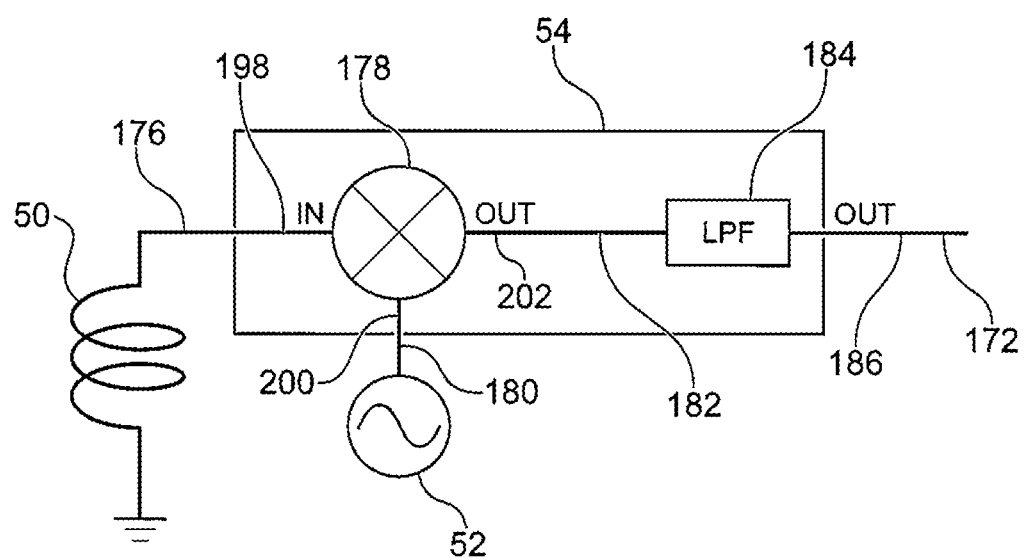
FIG. 4 is a block diagram illustrating the eddy current, sensor assembly of the present embodiment.

FIG. 4 illustrates an eddy current sensor assembly 174, The eddy current sensor assembly 174 includes the eddy current sensor 50 and the output signal processing circuit 54 that processes an output signal 176 from the eddy current sensor 50. The output signal processing circuit 54 accepts the output Signal 176 and a signal 180 of the predetermined frequency as input. The mixer circuit 178 multiplies the two input signals (the output signal 176 and the signal 180), and outputs an output signal 182 obtained by the multiplication. The output signal processing circuit 54 additionally includes a low-pass filter 184. The low-pass filter 184 accepts the output signal 182 output by the mixer circuit 178 as input, cuts a high-frequency signal included in the output signal 182 received as input, and outputs an output signal 186 including at least a DC signal.

The eddy current sensor 50 includes an exciting coil for forming an eddy current in the metal film (or conductive film) on the semiconductor wafer WH, and a detecting coil that detects the generated eddy current. For example, the exciting coil and the detecting coil are disposed in the axial direction of a cylindrical ferrite core. The exciting coil is connected to the AC signal source 52, The exciting coil forms an eddy current in the metal film (or conductive film) mf on the semiconductor wafer WH disposed near the eddy current sensor 50 due to a magnetic field formed by the voltage supplied by the AC signal source 52, The detecting coil is disposed on the upper side (the metal flint (or conductive film) side) of the ferrite core, and detects the magnetic field generated by the eddy current formed in the metal film (or conductive film). In FIG. 4, the exciting coil is not illustrated. The signal 180 having the same frequency as the voltage supplied to the exciting coil is supplied to the mixer circuit 178 from the AC signal source 52.

The mixer circuit 178 is an analog multiplier or a digital multiplier. The mixer circuit 178 is a circuit that accepts two voltage signals having the same (or different) frequency components f1 and f2, and performs a multiplication operation, on both signals. The mixer circuit 178 is also referred to by terms such as mixer, mixing circuit, frequency mixer, frequency mixing circuit, MIX, frequency transducer, frequency conversion circuit, and frequency converter. The purpose of the mixer circuit is to multiply two input, signals and extract a sum or a difference of respective frequencies of the two signals (perform frequency conversion), in the case where the respective frequencies of the two input signals are the same, the phase difference between, the two signals can be extracted.

The mixer circuit 178 includes an input port 198, a local oscillator port 200, and an output port 202, The output signal 176 from the eddy current sensor 50 is input into the input port 198. The signal 180 from the AC signal source 52 is input into the local oscillator port 200. The output signal 176 and the signal 180 have the same frequency. The result of multiplying the output signal 176 and the signal 180 in the mixer circuit 178 is output from the output port 202, The output signal 182 output by the output port 202 is input into the low-pass filter 184. By passing through the low-pass filter 184, the amount of phase change (phase difference) between the output signal 176 and the signal 180 detected by the eddy current sensor 50 is extracted as a DC signal (the output signal 186). The cutoff frequency of the low-pass filter can be set in the range from 1 Hz to 1.0 Hz, for example.

The processing performed by the mixer circuit 178 is as follows. Let the output signal 176 be $A \cdot \sin(\omega t + \theta_A)$. Let the signal 180 be $B \cdot \sin(\omega t + \theta_B)$. In the above, A and B are the respective amplitudes (mv, for example) of the output signal 176 and the signal 180, $\omega$ is the frequency (1/s), t is the time (s), and $\theta_A$ and $\theta_B$ are the respective phases of the output signal 176 and the signal 180. The output signal 182 from the mixer circuit 178 is $A \cdot \sin(\omega t + \theta_A) \cdot B \cdot \sin(\omega t + \theta_B) = (\frac{1}{2}) A \cdot B \cdot \cos(\omega t + \theta_A + \omega t + \theta_B) + (\frac{1}{2}) A \cdot B \cdot \cos(\omega t + \theta_A - \omega t - \theta_B)$ $(\frac{1}{2}) A \cdot B \cdot \cos(2\omega t + \theta_A + \theta_B) + (\frac{1}{2}) A \cdot B \cdot \cos(\theta_A - \theta_B)$. When this signal is input into the low-pass filter 184, the first term above is eliminated, and the output signal 186 from the low-pass filter 184 is the second term $(\frac{1}{2}) \cdot A \cdot B \cdot \cos(\theta_A - \theta_B)$ above, or in other words, a DC signal.

In the present embodiment, the output signal 176 from the eddy current sensor 50 is connected to the mixer circuit 178 without going through a resistance bridge circuit. Because a resistance bridge circuit susceptible to the influence of temperature changes is not used, it is possible to provide the output signal processing circuit 54 of the eddy current sensor 50 that is less susceptible to the influence of changes in the surrounding environment compared to the related art.

Figure 6:
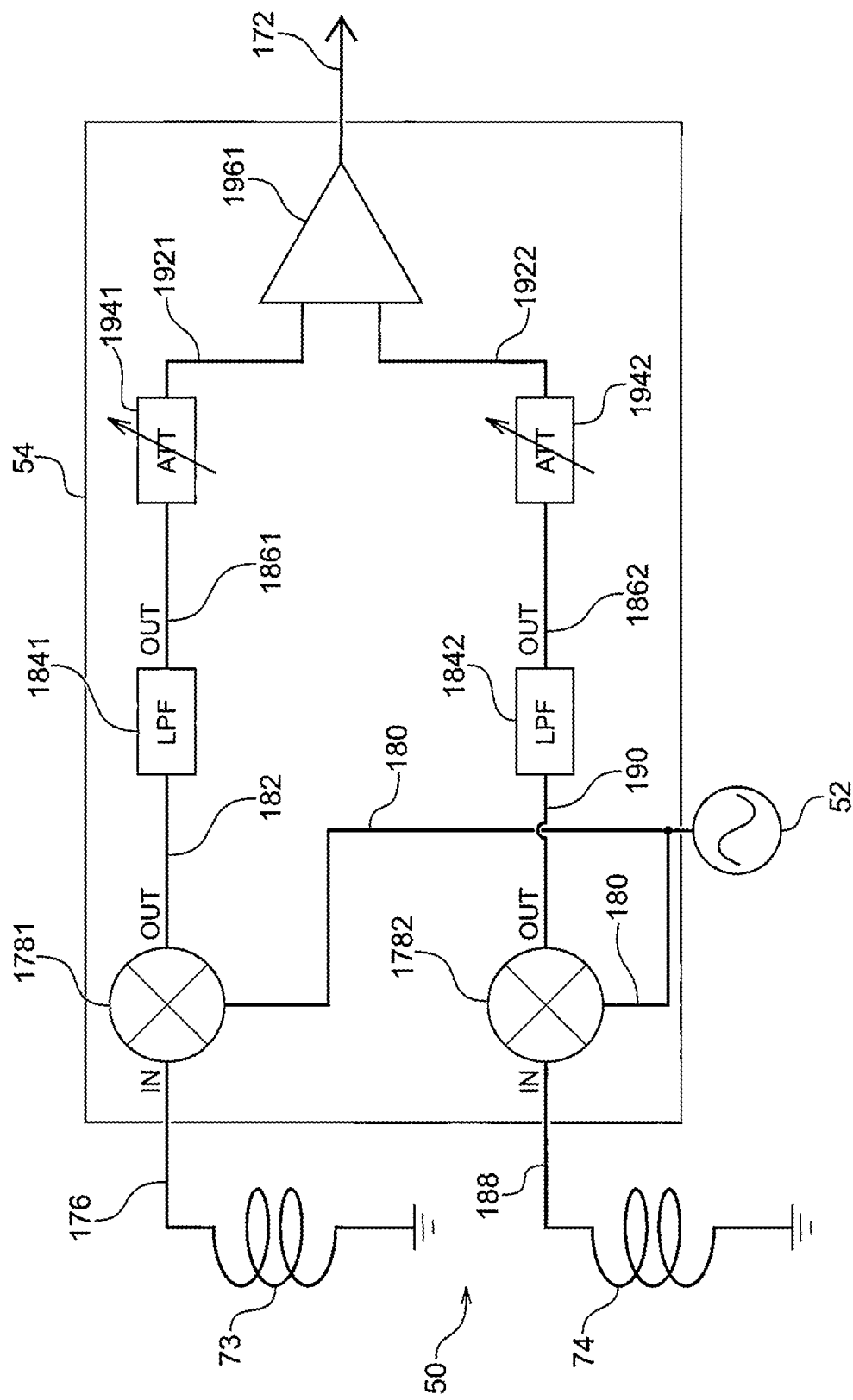
FIG. 6 is a schematic diagram illustrating an output signal processing circuit according to another embodiment.

Also, as illustrated in FIG. 6 of Japanese Patent Laid-Open No. 2011-23579, a signal detected at the terminal of a resistance bridge circuit passes through a high-frequency amplifier and a phase shift circuit, and the cos component and the sin component of the detection signal are extracted by a synchronous detection unit containing a cos synchronous detector circuit and a sin synchronous detector circuit.

In the synchronously detected signals, an unwanted high-frequency component above the signal component is removed by a low-pass filter, Consequently, the high-frequency output that the coil outputs becomes a low-frequency signal after passing through long processing steps. Because there are many steps involving a high-frequency signal the signal is noisy in the related art.

In the present embodiment, the high-frequency output (output signal 176) output by the cod of the eddy current sensor 50 becomes a low-frequency signal (output signal 186) by the mixer circuit 178 and the low-pass filter 184. Because there are few steps involving the output signal 176 which is a high-frequency signal the output Signal 186 contains less noise compared to the related art. In other words, because the signal is converted from a high-frequency signal susceptible to the influence of the surroundings into an easy-to-handle DC signal at an early stage (in few steps), consistent signal measurement can be performed.

In FIG. 4, when the signal 180 and the output signal 176 are compared, in the case where the phase change between the two signals is large and the amplitude change is small, it is preferable to measure the film thickness according to the phase change. In the case where the phase change between the two signals is small and the amplitude change is small, it is preferable to measure the film thickness according to the amplitude change. In the case where the phase change between the two signals is large and the amplitude change is also large. It is preferable to measure the film thickness according to the phase change and the amplitude change. Additionally, the signal 180 does not have to be a sine wave. For example, a square wave of the same frequency as the output signal 176 may also be used. Furthermore, it is sufficient for the frequencies of the output signal 176 and the signal 180 to be substantially the same without being strictly the same. In the case of a large frequency discrepancy between the output signal 176 and the signal 180, at least one of the frequencies of the output signal 176 and the signal 180 may be input into the mixer circuit 178 after being adjusted by a frequency adjustment circuit.

Figure 5:
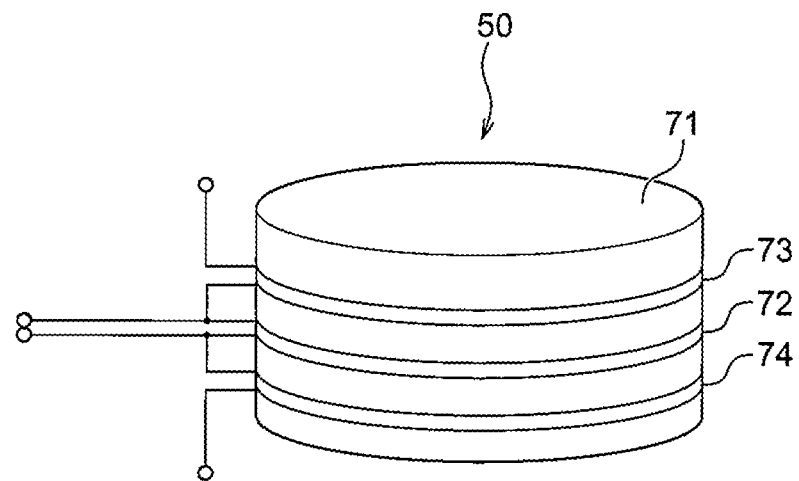
FIG. 5 is a schematic diagram illustrating an exemplary configuration of a coil in the eddy current sensor of the present embodiment.

Next, a different embodiment of the present invention wilt be described. FIG. 5 is a schematic diagram illustrating an exemplary configuration of a coil in the eddy current sensor 50 of the present embodiment. In the present embodiment, the eddy current sensor 50 includes an exciting coil 72 for forming an eddy current in the metal film (or conductive film), a detecting coil 73 for detecting the eddy current of the metal film (or conductive film), and a dummy coil 74. The eddy current sensor 50 includes the coils of the exciting coil 72, the detecting coil 73, and the dummy coil 74 in three layers wound around a ferrite core 71, Note that the structure of the eddy current sensor 50 is not limited to the structures illustrated in FIGS. 4,5, and 8, and any structure may be adopted.

Here, the exciting coil 72 in the center is connected to the AC signal source 52. The exciting coil 72 forms an eddy current in the metal film (or conductive Him) mf on the semiconductor wafer WH disposed near the eddy current sensor 50 due to a magnetic field formed by the voltage supplied by the AC signal source 52. The detecting coil 73 is disposed on the upper side (the metal film (or conductive film) side) of the ferrite core 71, and detects the magnetic field generated by the eddy current formed in the metal film (or conductive film). Additionally, the dummy coil 74 is disposed on the side of the exciting coil 72 opposite the detecting coil 73, The exciting coil 72, the detecting coif 73, and the dummy coil 74 are coils having the same number of turns (from 1 t to 20 t), for example. The reason for providing the dummy coil 74 is to enable the output from the output signal processing circuit 54 to be adjusted to zero when a metal film (or conductive film) is not present.

FIG. 6 is a schematic diagram illustrating the output signal processing circuit 54 according to the present embodiment. The eddy current sensor 50 includes the detecting coil 73 (first coil) and the dummy cod 74 (second coil) that output the output signal 176 (first output signal) and an output signal 188 (second output signal), respectively. The output signal processing circuit 54 processes the output signal 176 and the output signal 188 output by the eddy current sensor 50. The output signal processing circuit 54 includes a mixer circuit 1781 (first mixer circuit) that accepts the output signal 176 and the signal 180 of the predetermined frequency output by the AC signal source 52 as input, multiplies the output signal 176 and the signal 180 received as input, and outputs an output signal 182 obtained by the multiplication, and a low-pass filter 1841 (first low-pass filter) that accepts the output signal 182 output by the mixer circuit 1781 as input, cuts a high-frequency signal included in the output signal 182 received as input, and outputs an output signal 1861 including at least a DC signal.

The output signal processing circuit 54 additionally includes a mixer circuit 1782 (second mixer circuit) that accepts the output signal 188 and the signal 180 of the predetermined frequency output by the AC signal source 52 as input, multiplies the output signal 188 and the signal ISO received as input, and outputs an output signal 190 obtained by the multiplication, and a low-pass filter 1842 (second low-pass filter) that accepts the output signal 190 output by the mixer circuit 1782 as input, cuts a high-frequency signal included in the output signal 190 received as input, and outputs an output signal 1862 including at least a DC signal.

The output signal processing circuit 54 additionally includes a first subtracter circuit 1961 (subtracter circuit) that accepts the output signal 1861 output by the low-pass filter 1841 and the output signal 1862 output by the low-pass filter 1842 as input, calculates a difference between the two output signals 1861 and 1862 received as input, and outputs the obtained difference.

Furthermore, the output signal processing circuit. 54 may also include a first adjustment circuit 1941 that accepts the output signal 1861 (DC signal) output by the low-pass filter 1841 as input, adjusts the magnitude of the amplitude of the output signal 1861 received as input, and outputs an adjusted DC signal 1921 and a second adjustment circuit 1942 that accepts the output signal 1862 (DC signal) output by the low-pass filter 1842 as input, adjusts the magnitude of the amplitude of the output signal 1862 received as input, and outputs an adjusted DC signal 1922, and additionally include a first subtracter circuit 1961 (subtracter circuit) that, calculates a difference between the adjusted DC signal 1921 output by the first adjustment circuit 1941 and the adjusted DC signal 1922 output by the second adjustment circuit 1942 as input, and outputs the obtained difference.

Also in the present embodiment, the output signal 176 from the eddy current sensor 50 and the output signal IBS are connected to the miser circuit 1781 and the mixer circuit 1782 without going through a resistance bridge circuit. Because a resistance bridge circuit susceptible to the influence of temperature changes is not used, it is possible to provide the eddy current sensor output signal processing circuit 54 that is less susceptible to the influence of changes in the surrounding environment compared to the related art.

In the present embodiment, the first subtractor circuit 1961 is capable of performing detection similar to the detection method using a bridge circuit of the related art, in which two coils are used to extract a tiny signal change corresponding to a film thickness change. In other words, it is possible to calculate the difference between two DC signals to detect only a tiny signal change corresponding to a film thickness change.

Figure 7:
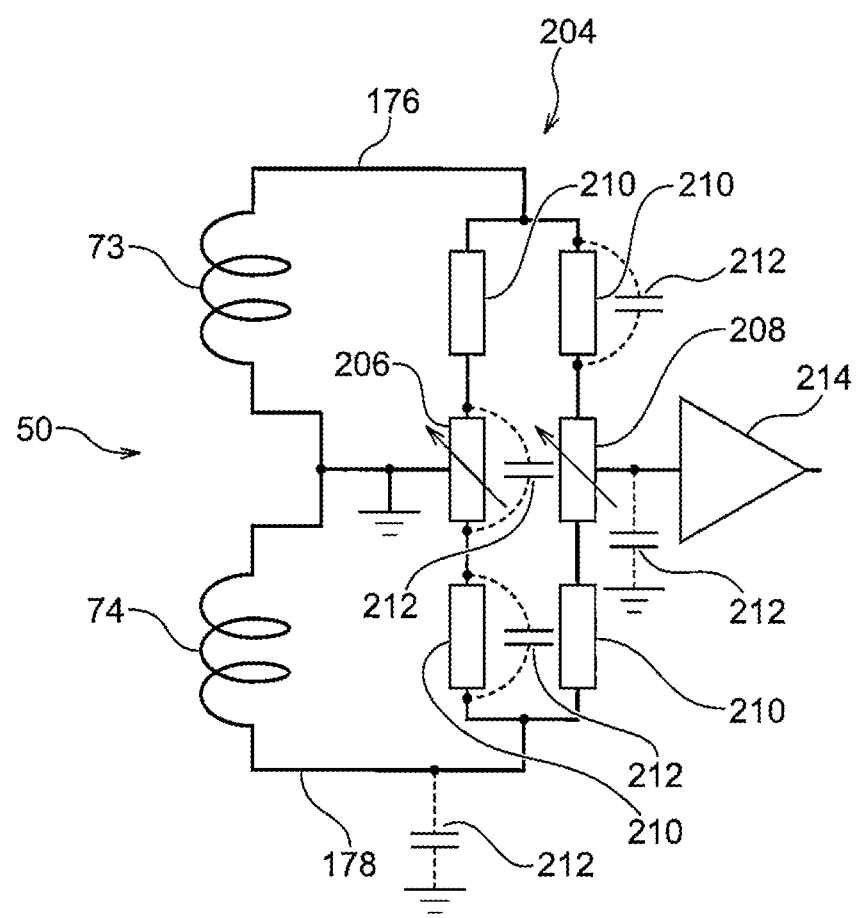
FIG. 7 is a diagram illustrating a resistance bridge circuit.

At this point. FIG. 7 will be used to describe a detection method using a bridge circuit as a comparative example. As illustrated in FIG. 7, of the three coils of the exciting coil 72, the detecting coil 73, and the dummy coil 74, the detecting coil 73 and the dummy coil 74 form a series circuit, both ends of which are connected to a resistance bridge circuit 204 that includes a variable resistance 206, a variable resistance 208, and a fixed resistance 210. By adjusting the balance with the variable resistance 206 and the variable resistance 208 of the resistance bridge circuit 204, it is possible to adjust the zero point such that the output of the resistance bridge circuit 204 goes to zero when the film thickness is zero. The output of the resistance bridge circuit 204 is input into a synchronous detector circuit 214, as illustrated in FIG. 7. The synchronous detector circuit 214 extracts a resistance component (R), a reactance component (X), an amplitude output (Z), and a phase output ($\tan^{-1}$R/X) associated with changes in the film thickness from the input signal. A stray capacitance 212 of the resistance Is generated in this circuit.

The magnitude of adjustment to the resistance values of the variable resistance 206 and the variable resistance 208, or in other words the magnitude of adjustment to the resistance value during zero-point adjustment, is extremely small compared to the magnitude of the entire resistance value forming the bridge circuit. As a result, the magnitude of a temperature change in the entire resistance value is non-negligible compared, to the magnitude of the zero-point adjustment. Because of change in the resistance value due to temperature change, the stray capacitance of the resistance, and the like, the properties of the resistance bridge circuit 204 are highly susceptible to the influence of changes in the surrounding resistance environment. As a result, there is a problem in that the zero point described above shifts easily, and the accuracy of measuring the film thickness falls.

Returning to the description of FIG. 6, the first subtractor circuit 1961 accepts the DC signal 1921 output by the first adjustment circuit 1941 and the DC signal 1922 output by the second adjustment circuit 1942 as input, calculates a difference between the two DC signals 1921 and 1922 received as input, and outputs the obtained difference. The reasons for providing the first adjustment circuit 1941 and the second adjustment circuit 1942 are as follows.

With an adjustment circuit and a subtractor circuit, it is possible to maintain substantially the same performance as the detection method using a resistance bridge circuit of the related art, in which two coils (the detecting coil 73 and the dummy coil 74) are used to extract a tiny signal change corresponding to a film thickness change. Namely, the level of the phase detection signal from at least one of the coils (but in the ease of FIG. 6, the two coils of the detecting coil 73 and the dummy coil 74) is subtracted after being adjusted by the adjustment circuit to detect only a tiny signal change corresponding to a film thickness change. With the adjustment circuit, the accuracy of the zero-point adjustment cart be improved, compared to the case without the adjustment circuit. Consequently, tiny changes in the signal from the zero point described above can be extracted. It is also acceptable to provide only one of the first adjustment circuit 1941 and the second adjustment circuit 1942, This is because even with a single adjustment circuit, zero-point adjustment is possible in some cases by adjusting the level of the phase detection signal with the adjustment circuit.

The first adjustment circuit 1941 and the second adjustment circuit 1942 are attenuators, for example. An attenuator refers to a circuit element or device that attenuates a signal input into the attenuator to a suitable signal level (amplitude). The first adjustment circuit 1941 and the second adjustment circuit 1942 may also be amplifiers, for example. Besides the reasons originating from the coil properties, the following are also reasons for providing the first adjustment circuit 1941 and the second adjustment circuit 1942.

A mixer circuit or a low-pass filter may output an input signal with an amplified or attenuated amplitude in some cases. In such cases, the first adjustment circuit 1941 and the second adjustment circuit 1942 are necessary to adjust the amplitude of the output from the mixer circuit or the low-pass circuit.

Figure 8:
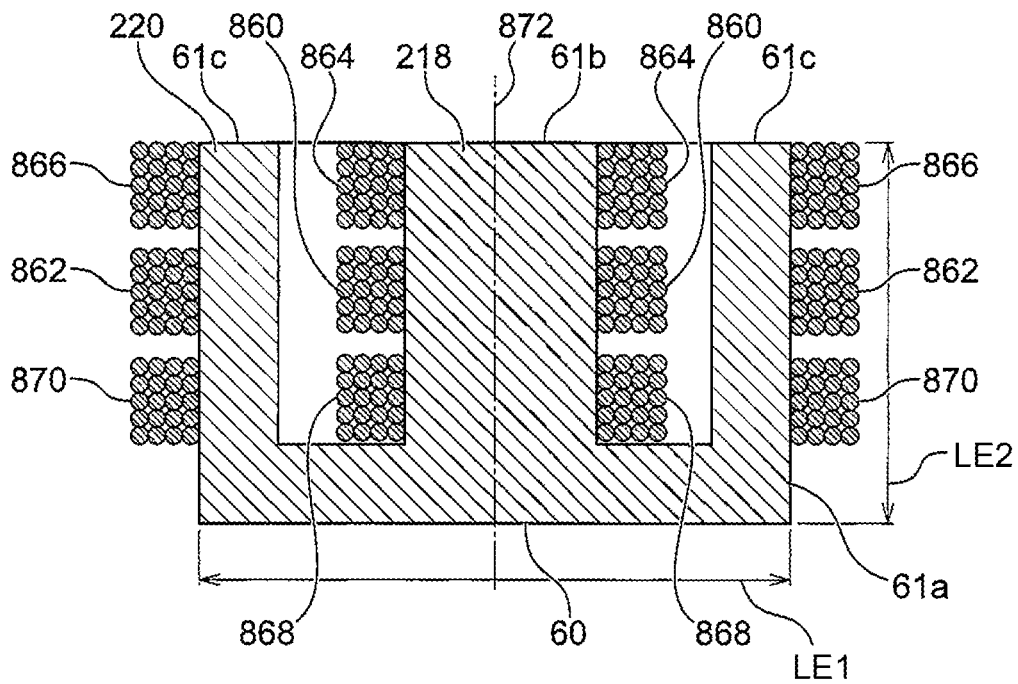
FIG. 8 is a schematic diagram illustrating an exemplary configuration of an eddy current sensor of another embodiment.
Figure 9:
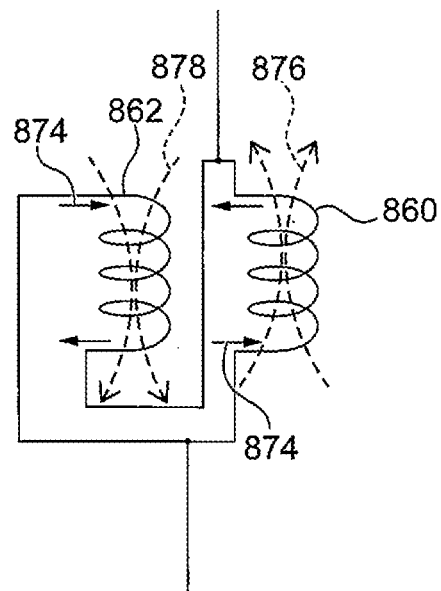
FIG. 9 is a schematic diagram illustrating aa exemplary connection of an exciting coil in the eddy current sensor.

Next, a different embodiment of the present invention will be described. FIGS. 8 and 9 are schematic diagrams illustrating an exemplary configuration of the eddy current sensor 50 and an exemplary connection of the exciting coil in the eddy current sensor according to the present embodiment. The eddy current sensor 50 disposed near the substrate on which a conductive film is formed includes a pot core 60 and six coils 860, 862, 864, 866, 868, and 870. The pot core 60 is a magnetic material and has a floor part 61a (bottom magnetic material), a magnetic core part 61b (central magnetic material) provided in the center of the bottom face part 61a, and a surrounding wall part 61c (peripheral magnetic material) provided at the periphery of the floor part 61a. The surrounding wall part 61c is a wall provided at the periphery of the floor part 61a so as to surround the magnetic core part 61b. In the present embodiment, the floor part 61a has a circular disc shape, the magnetic core part 61b has a solid columnar shape, and the surrounding wall part 61c has a cylindrical shape surrounding the floor part 61a.

Of the six coils 860, 862, 864, 866, 868, and 870, the coils 860 and 862 in the center are exciting coils connected to the AC signal source 52, The exciting coils 860 and 862 form an eddy current in the metal film (or conductive film) mf on the semiconductor wafer WH disposed nearby due to a magnetic field formed by the voltage supplied by the AC signal source 52. The detecting coils 864 and 866 are disposed on the metal film side of the exciting coils 860 and 862, and detect the magnetic field generated by the eddy current formed in the metal film. The dummy coils 868 and 870 are disposed on the opposite side from the detecting coils 864 and 866 with the exciting coils 860 and 862 in between.

The exciting coil 860 is an inner coil disposed on the outer periphery of the magnetic core part 61b, is capable of generating a magnetic Held, and forms an eddy current in a conductive film. The exciting coil 862 is an outer coil disposed on the outer periphery of the surrounding wall part 61c, is capable of generating a magnetic Held, and forms an eddy current in a conductive film. The detecting coil 864 is disposed on the outer periphery of the magnetic core part 61b, is capable of detecting a magnetic field, and detects an eddy current formed in a conductive film. The detecting coil 866 is disposed on the outer periphery of the surrounding wall part 61c, is capable of detecting a magnetic field, and detects an eddy current formed in a conductive film.

The eddy current sensor includes the dummy coils 868 and 870 that detect an eddy current formed in a conductive film. The dummy coil 868 is disposed on the outer periphery of the magnetic core part 61b, and is capable of detecting a magnetic field. The dummy coil 870 is disposed on the outer periphery of the surrounding wall part 61c, and is capable of detecting a magnetic field. In the present embodiment, the detecting coils and the dummy coils are disposed on the outer periphery of the floor part 61*a* and the outer periphery of the surrounding wall part 61*c*, but the detecting coils and the dummy coils may also be disposed on only one of either the outer periphery of the floor part 61*a* or the outer periphery of the surrounding wall part 61*c*.

The axial direction of the magnetic core part 61*b* is orthogonal to the conductive film on the substrate, the detecting coils 864 and 866, the exciting coils 860 and 862, and the dummy coils 868 and 870 are disposed at different positions in the axial direction of the magnetic core part 61*b*, and additionally, the detecting coils 864 and 866, the exciting coils 860 and 862, and the dummy coils 868 and 870 are disposed to the above order in the axial direction of the magnetic core part. 61*b* proceeding from a position close to the conductive film on the substrate to a position farther away, A lead line (illustrated in FIG. 11) for connecting to the outside extends from each, of the detecting coils 864 and 866, the exciting coils 860 and 862, and the dummy coils 868 and 870.

FIG. 8 is a cross-section in a plane passing through a central axis 872 of the magnetic core part 61*b*. The pot core 60 is a magnetic material and has a columnar floor part 61*a*, a columnar magnetic core part 61*b* pro vided in the center of the floor part 61*a*, and a cylindrical surrounding wall part 61*c* provided on the circumference of the floor part 61*a*. As one example of the dimensions of the pot core 60, the diameter LE1 of the floor part 61*a* is approximately from 1 cm to 5 cm, and the height, LE2 of the eddy current sensor 50 is approximately from 1 cm to 5 cm. The outer diameter of the surrounding wall part 61*c* has the same cylindrical shape in the height direction in FIG. 8, but the outer diameter may also have a converging shape (tapered shape) that narrows in the direction going away from the floor part 61*a*, or in other words, narrows toward the tip.

The conducting wire used in the detecting coils 864 and 866, the exciting coils 860 and 862, and the dummy coils 868 and 870 is copper, Manganin wire, or nichrome wire. As a result of using Manganin wire or nichrome wire, there are fewer temperature changes due to electrical resistance and the like, and the temperature properties are improved.

In the present embodiment, wire rod is wrapped around the outside of the magnetic core part 61*b* and the outside of the surrounding wall part 61*c* made of ferrite or the like to form the exciting coils 860 and 862, and therefore the eddy current density flowing through the measurement target can be raised. Additionally, because the detecting coils 864 and 866 are also formed on the outside of the magnetic core part 61*b* and the outside of the surrounding wall part 61*c*, the generated reverse magnetic field (interlinkage flux) can be collective efficiently.

To raise the eddy current density flowing through the measurement target, in the present embodiment, the exciting coil 860 and the exciting coil 862 are additionally connected in parallel, as illustrated in FIG. 9. In other words, the inner coil and the outer coil are electrically connected in parallel. The reasons for connecting in parallel are as follows. When connected in parallel, the voltage that can be applied to the exciting coil 860 and the exciting coil 862 is increased, and the current flowing through the exciting coil 860 and the exciting coil 862 is increased over the case of connecting in series. Consequently, the magnetic field is larger. Also, when connected in series, the inductance of the circuit Increases, and the frequency of the circuit falls. This makes it difficult to apply tire necessary high frequency to tire exciting coils 860 and 862. The arrow 874 indicates the direction of current flowing through the exciting coil 860 and the exciting coil 862.

Figure 10:
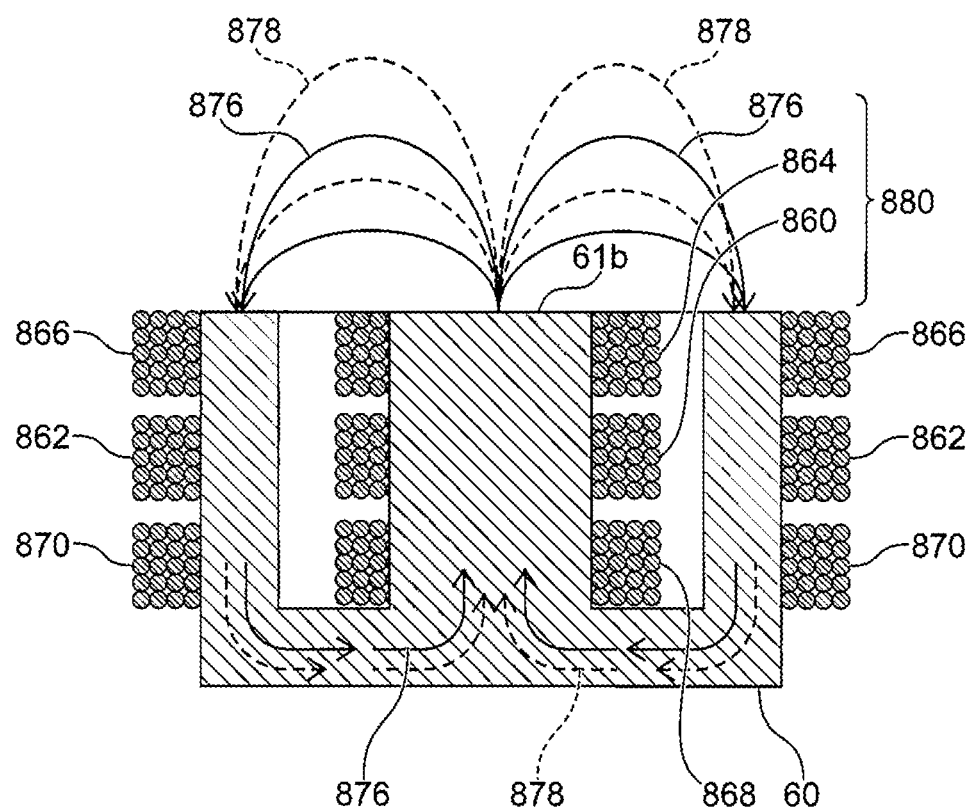
FIG. 10 is a diagram illustrating a magnetic field generated by the eddy current sensor.

As illustrated in FIG. 9, the exciting coil 860 and the exciting coil 862 are connected such that the exciting coil 860 and the exciting coil 862 have the same magnetic field direction. In other words, current flows in different directions in the exciting coil 860 and the exciting coil 862. A magnetic field 876 is the magnetic field generated by the exciting coil 860 on the inner side, while a magnetic field 878 is the magnetic field generated by the exciting coil 862 on the outer side. As illustrated in FIG. 10, the magnetic field directions of the exciting coil 860 and the exciting coil 862 are the same, in other words, the direction of the magnetic field that the inner coil generates inside the magnetic core part 61*b* is the same as the direction of the magnetic field that, the outer coil generates inside the magnetic core part 61*b*.

Because the magnetic field 876 and the magnetic field 878 illustrated in the region 880 have the same orientation, the two magnetic fields are added together and become larger. Compared to the case where only the magnetic field 876 generated by the exciting coil 860 exists like in the related art, in the present embodiment, the magnetic field is larger by the extent of the magnetic field 878 generated by the exciting coil 862.

The detecting coil 864, the exciting coil 860, and the dummy coil 868 correspond to the detecting coil 73, the exciting coil 72, and the dummy coil 74 of FIG. 5. The detecting coil 866, the exciting coil 862, and the dummy coil 870 correspond to the detecting coil 73, the exciting coil 72, and the dummy coil 74 of FIG. 5. In other words, the eddy current sensor of FIG. 10 has a structure in which two of the eddy current sensor in FIG. 5 are disposed concentrically. Accordingly, the output signal processing circuit 54 corresponding to the eddy current sensor of FIG. 10 preferably includes two of the output signal processing circuit 54 illustrated in FIG. 6.

Figure 11:
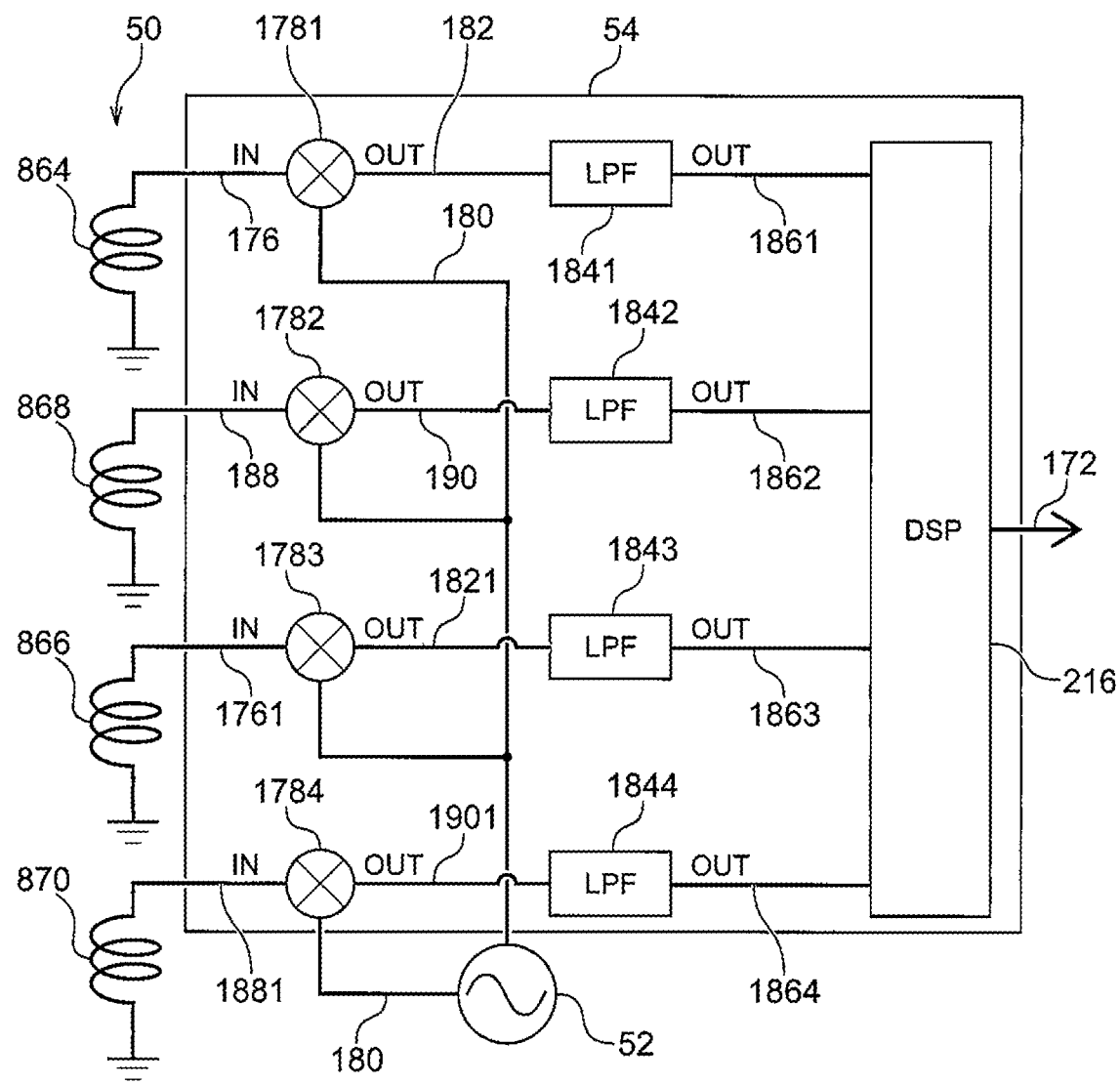
FIG. 11 is a schematic diagram illustrating an output signal processing circuit according to another embodiment.

An example of the output signal processing circuit 54 corresponding to the eddy current sensor of FIG. 10 is illustrated in FIG. 11. The eddy current sensor 50 includes the detecting coil 864 (first coil) and the dummy coil 868 (second coil) that output the output signal 176 (first output signal) and the output signal 188 (second output signal), respectively. The eddy current sensor 50 includes the detecting coil 866 (third coil) and the dummy coil 870 (fourth, coil) that output a third output signal 1761 and a fourth, output signal 1881, respectively.

The processing by the mixer circuit 1781, the mixer circuit 1782, the low-pass filter 1841, and the low-pass filter 1842 associated with the first output signal and the second output signal is as described above, and therefore a description is omitted.

The output signal processing circuit 54 includes a third mixer circuit 1783 that accepts the third output signal 1761 and the signal 180 of the predetermined frequency output by the AC signal source 52 as input, multiplies the two signals received as input, and outputs an output signal 1821 obtained by the multiplication, and a third low-pass filter 1843 that accepts the output signal 1821 output by the third mixer circuit 1783 as input, cuts a high-frequency signal included, in the output signal 1821 received as input, and outputs an output signal 1863 including at least a DC signal.

The output signal processing circuit 54 includes a fourth mixer circuit 1784 that accepts the fourth output signal 1881 and the signal 180 of the predetermined frequency output by the AC signal source 52 as input, multiplies the two signals received as input, and outputs an output signal 1901 obtained by the multiplication, and a fourth, low-pass filter 1844 that accepts the output signal 1901 output by the fourth mixer circuit 1784 as input, cuts a high-frequency signal included in the output signal 1901 received as input, and outputs an output signal 1864 including at least a DC signal.

Figure 13:
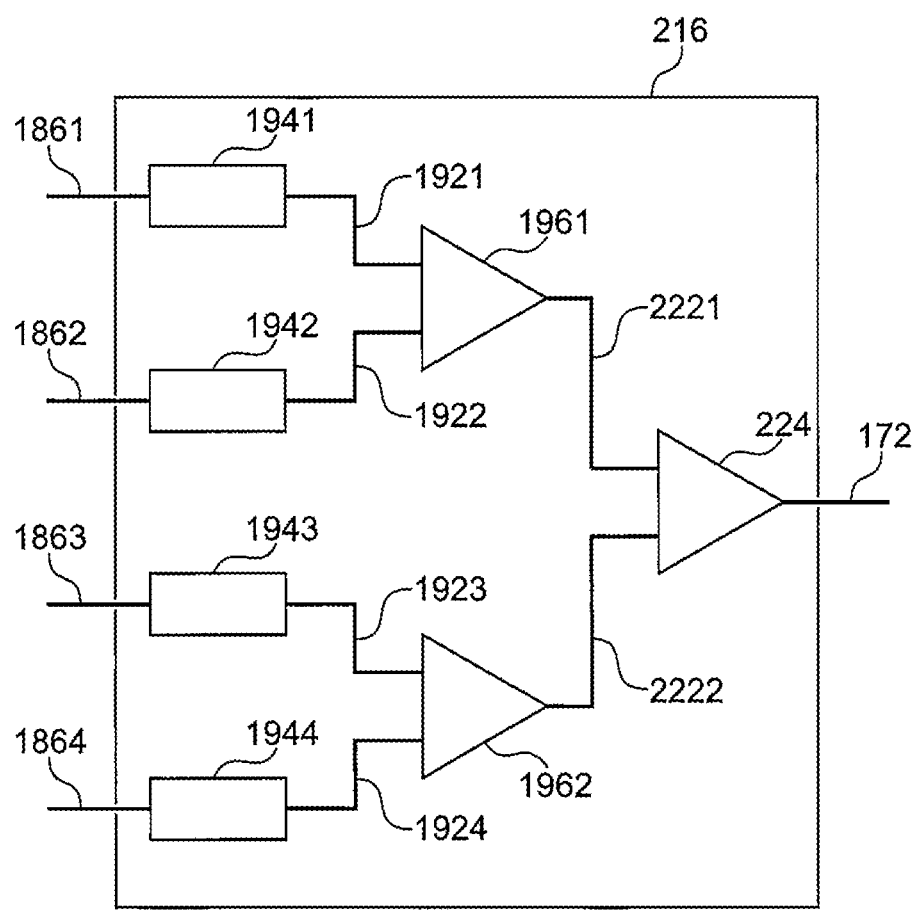
FIG. 13 is a schematic diagram illustrating a circuit configuration inside a digital signal processor.
Figure 14A:
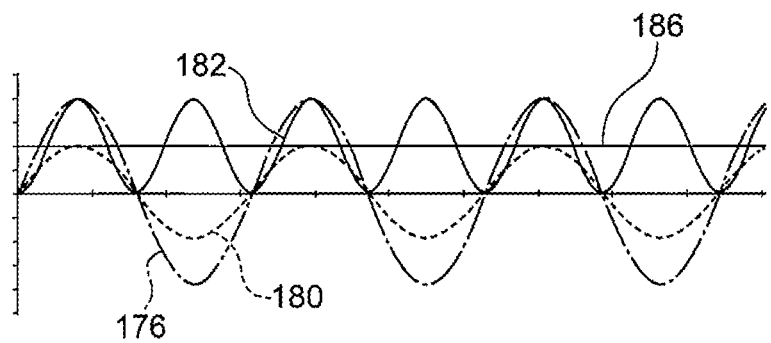
FIG. 14A is a diagram illustrating how a direct-current (DC) signal changes depending on a phase difference between an output signal of the eddy current sensor and a signal from an alternating-current (AC) signal source.
Figure 14B:
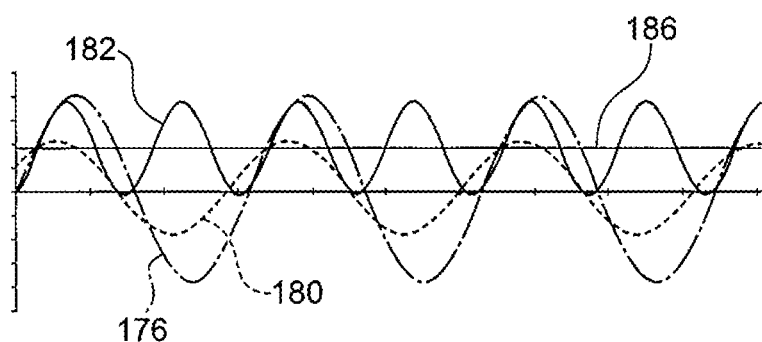
FIG. 14B is a diagram illustrating how the DC signal changes depending on the phase difference between the output signal of the eddy current sensor and the signal from the AC signal source.
Figure 14C:
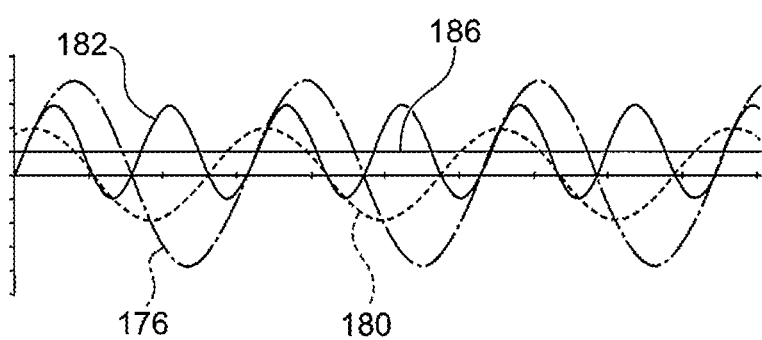
FIG. 14C is a diagram illustrating how the DC signal changes depending on the phase difference between the output signal of the eddy current sensor and the signal from the AC signal source.
Figure 14D:
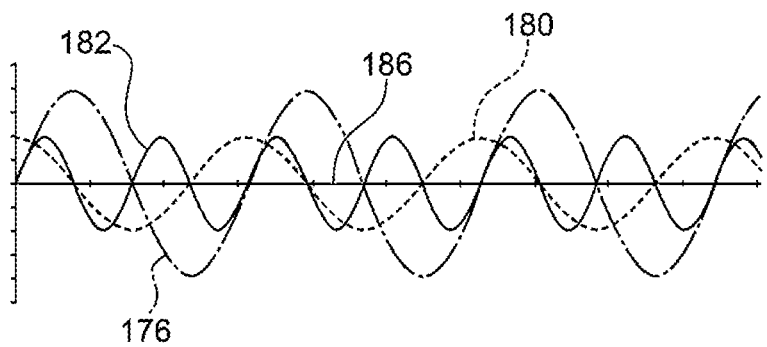
FIG. 14D is a diagram illustrating how the DC signal changes depending on the phase difference between the output signal of the eddy current sensor and the signal from the AC signal source.

An internal configuration of a digital signal processor 216 is illustrated in FIG. 13. The output signal processing circuit 54 includes a second subtractor circuit 1962 that accepts the output signal 1863 output by the third, low-pass filter 1843 and the output signal. 1864 output by the fourth low-pass filter 1844 as input, calculates a difference 2222 between the two DC signals received as input, and outputs the obtained difference 2222, and an adder circuit 224 that receives the difference 2221 output by the first subtractor circuit 1961 and the difference 2222 output by the second subtracter circuit 1962 as input, calculates a sum of the two differences or a difference between the two differences received as input, and outputs the obtained sum or difference as the output signal 172.

In the present embodiment, the digital signal processor (DSP) 216 includes the functions of the first, second, third, and fourth adjustment circuits, the first and second subtractor circuits, and the adder circuit. In other words, the digital signal processor 216 may also include a third adjustment circuit 1943 that receives the output signal 1863 (DC signal) output by the third low-pass filter 1843 as input, adjusts the magnitude of the amplitude of the output signal 1863 received as input, and outputs an adjusted DC signal 1923, and a fourth adjustment circuit 1944 that receives the output signal 1864 (DC signal) output by the fourth low-pass filter 1844 as input, adjusts the magnitude of the amplitude of the output signal 1864 received as Input, and outputs an adjusted DC signal 1924, The digital signal processor 216 is a microprocessor suitable for digital signal processing. At least one of the first, second, third, and fourth adjustment circuits, the first and second subtractor circuits, and the adder circuit may also be provided independently as an analog circuit or a digital circuit.

The present embodiment includes a coil assembly with two coils in addition to the coil assembly with two coils illustrated in FIG. 5. In other words, there are two pairs of two coils. Because there are two pairs, the measurement accuracy is improved by obtaining the sum of the differences between the two DC signals or the difference of the differences between the two DC signals obtained by the two pairs. The measurement accuracy is improved because of the following reasons. In the case of taking the sum, the signal output is increased, and since smaller signal changes, or in other words smaller film thickness changes can be detected, the measurement accuracy is improved.

Figure 12:
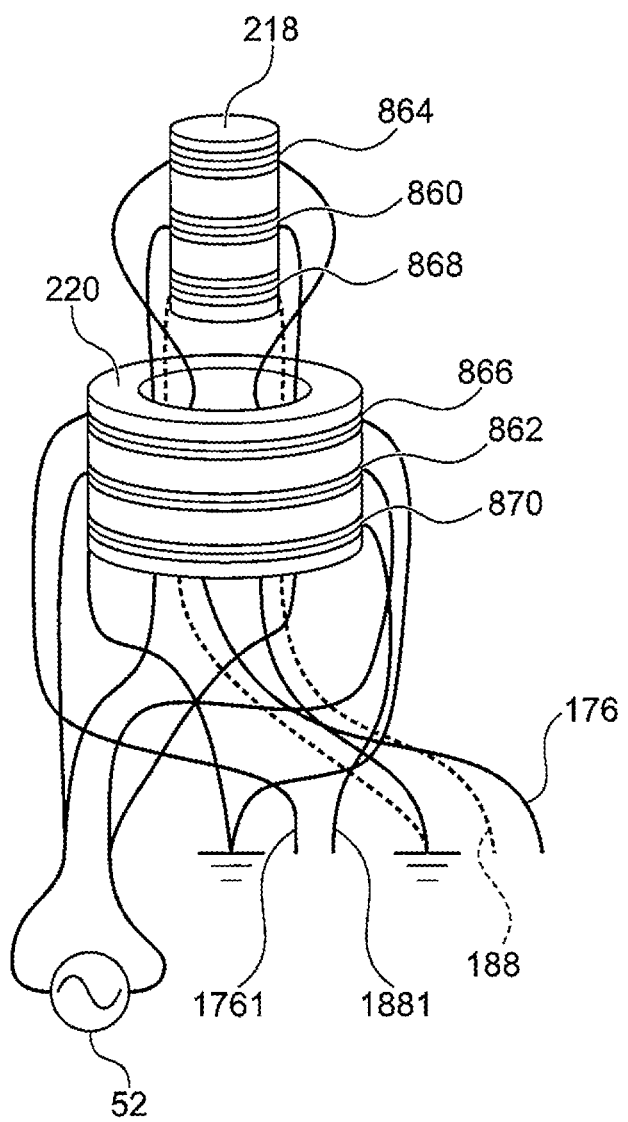
FIG. 12 is a perspective view of the eddy current sensor according to the other embodiment illustrated in FIG. 8.

In the case of taking the difference, one pair is capable of measuring the film thickness over a wider area than the other pair, for example. In this case, by subtracting the output of one pair from the other pair, the influence of the him thickness over a wide area can be reduced and only the change in film thickness over a narrow area can be measured more accurately. In other words, the spatial precision of measurement can be improved, FIG. 12 illustrates a perspective view of the eddy current sensor illustrated in FIG. 8, In FIG. 12, a top face 218 is illustrated above a top face 220 for easier understanding, but the top face 218 and the top face 220 are in the same horizontal plane as illustrated in FIG. 8. In FIG. 12, there are two coil assemblies, but there may also be three or more coil assemblies. In the case where there are two or more coil assemblies, the measurement accuracy (S/N ratio) is improved because of the increased number of film thickness measurements compared to the case of a single coil assembly.

In the present embodiment, the output signal from the eddy current sensor likewise is connected to the mixer circuit without going through a resistance bridge circuit. Because a resistance bridge circuit susceptible to the influence of temperature changes is not used, it is possible to provide the eddy current sensor output signal processing circuit that is less susceptible to the influence of changes in the surrounding environment compared to the related art.

In the present embodiment, the subtractor circuit is capable of performing detection similar to the detection method using abridge circuit of the related art, in which two coils are used to extract a tiny signal change corresponding to a film thickness change. In other words, it is possible to calculate the difference between two DC signals to detect only a tiny signal change corresponding to a film thickness change.

The multiplier circuit and the subtractor circuit may also be a circuit, that outputs the result of the multiplication and subtraction multiplied by a predetermined constant (where the constant may be 1, less than 1, or greater 1), or in other words, outputs an amplified output signal.

FIGS. 14A, 14B, 14C, and 14D illustrate how the output signal 186, which is a DC signal, changes depending on the phase difference between the output signal 176 from the eddy current sensor 50 (illustrated in FIG. 4) and the signal 180 from the AC signal source 52. FIGS. 14A, 14B, 14C, and 14D illustrate cases where the phase difference is 0 degrees, 30 degrees, 60 degrees, and 90 degrees, respectively. As the phase difference becomes larger, the output signal 186 becomes smaller. Is the graphs, the horizontal axis is time (s) and the vertical, axis is amplitude (mv).

Next, a method of processing the output signal from the eddy current sensor will be described, in FIG. 4, the output signal 176 from the eddy current sensor 50 and the signal 180 from the AC signal source 32 are input into the mixer circuit 178, The two signals are multiplied by the mixer circuit 178, and the output signal 182 obtained by the multiplication is output. The output signal 182 output by the mixer circuit 178 is input into the low-pass filter 184, a high-frequency signal is cut, and at least the DC signal 186 is output.

Next, a different method of processing the output signal from the eddy current sensor will be described. In FIG. 6, the first and second output signals 176 and 188 output by the eddy current sensor 50 including the first and second coils 73 and 74 that respectively output the first and second output signals 176 and 188 are processed.

The first output signal 176 and the signal 180 from the AC signal source 52 are input into the first mixer circuit 1781, the two signals are multiplied by the first mixer circuit 1781, and the output signal 182 obtained by the multiplication is output. The output signal 182 output by the first mixer circuit 1781 is input into the first low-pass filter 1841, a high-frequency signal included in the output signal 182 is cut by the Fust low-pass filter 1841, and at least the DC signal 1861 is output.

The second output signal 188 and the signal 180 from the AC signal source 52 are input into the second mixer circuit 1782, the two signals are multiplied by the second mixer circuit 1782, and the output signal 190 obtained by the multiplication is output. The output signal 190 output by the second mixer circuit 1782 is input into the second low-pass filter 1842, a high-frequency signal included in the output signal 190 is cut by the second low-pass filter 1842, and at least the DC signal 1862 is output.

The DC signal 1861 output by the first low-pass filter 1841 and the DC signal 1862 output by the second low-pass filter 1842 are input into the first subtractor circuit 1961, the difference 172 between the two DC signals is obtained by the first subtractor circuit 1961, and the obtained difference 172 is output.

Next, a different method of processing the output signal from the eddy current sensor will be described. In FIG. 11, the eddy current sensor includes the third and fourth coils 866 and 870 that output the third and fourth output signals 1761 and 1881, respectively. The third output signal 1761 and the signal 180 from the AC signal source 52 are input, into the third mixer circuit 1783, the two signals are multiplied by the third mixer circuit 1783, and the output signal 1821 obtained by the multiplication is output.

The output signal 1821 from the third mixer circuit 1783 is input into the third low-pass filter 1843, a high-frequency signal included in the output signal 1821 is cut by the third low-pass filter 1843, and at least, the DC signal 1863 is output. The fourth output signal 1881 and the signal 180 from the AC signal source 52 are input into the fourth mixer circuit 1784, the two signals are multiplied by the fourth mixer circuit 1784, and the output signal 1901 obtained by the multiplication is output.

The output signal 1901 from the fourth mixer circuit 1784 is input into the fourth low-pass filter 1844, a high-frequency signal included in the output signal 1901 is cut by the fourth low-pass filter 1844, and at least the DC signal 1864 is output. The DC signal 1863 output by the third low-pass filter 1843 and the DC signal 1864 output by the fourth, low-pass filter 1844 are input into the second subtractor circuit 1962, the difference 2222 between the two DC signals 1863 and 1864 is obtained by the second subtracter circuit 1962, and the obtained difference 2222 is output. The difference 2221 output by the first subtractor circuit 1961 and the difference 2222 output by the second subtracter circuit 1962 are input into the adder circuit 224. The sum of the two differences 2221 and 2222 or the difference between the two differences 2221 and 2222 is obtained by the adder circuit 224, and the obtained sum 172 or difference 172 is output.

A method of controlling each unit of the polishing apparatus on the basis of the film thickness obtained by the eddy current sensor 50 is described hereinafter. As illustrated in FIG. 1, the eddy current sensor 50 is connected to an endpoint detection controller 246, and the endpoint detection controller 246 is connected to an equipment controller 248. The output signal from the eddy current sensor 50 is sent to the endpoint detection controller 246, The endpoint detection controller 246 performs necessary processing (arithmetic processing and correction) on the output signal from the eddy current sensor 50 to generate a monitoring signal (film thickness data corrected by the endpoint detection controller 246). The equipment controller 248 controls components such as the top ring motor 114 and a motor for the polishing table 100 (not illustrated) on the basis of the corrected film thickness data.

Figure 15:
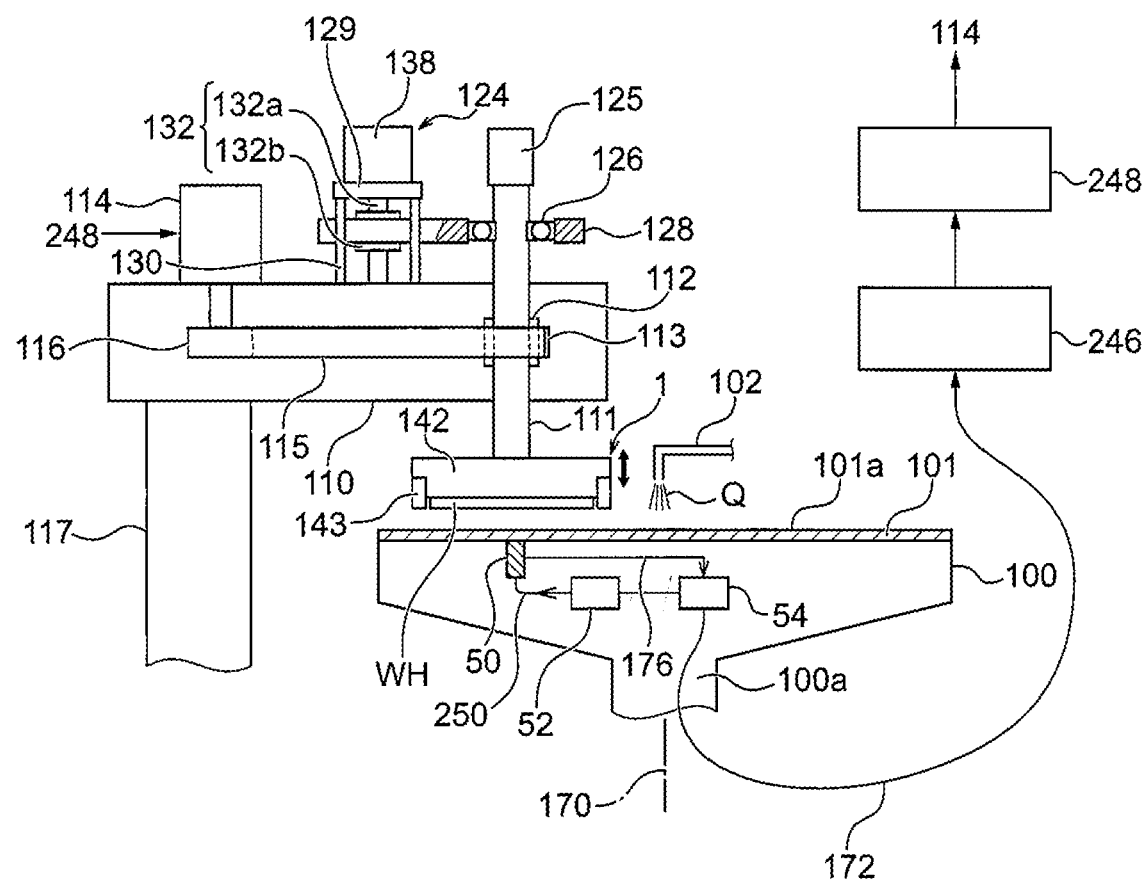
FIG. 15 is a schematic diagram illustrating an overall configuration of a polishing apparatus according to another embodiment of the present invention.

FIG. 15 is a schematic diagram illustrating an overall configuration of a polishing apparatus to which an eddy current sensor 50 according to another embodiment of the present invention is applied. As illustrated in FIG. 15, the polishing apparatus is provided with a polishing table 100 and a top ring (holding unit) 1 that holds a substrate to be polished, such as a semiconductor wafer, against a polishing surface on the polishing table.

The polishing table 100 is coupled to a motor (not illustrated) that acts as a driving unit disposed underneath through a table spindle 170, and is capable of rotating about the table spindle 170, A polishing pad 101 is affixed to the top face of the polishing table 100, and the surface 101a of the polishing pad 101 forms a polishing surface that polishes a semiconductor wafer WH. A polishing liquid supply nozzle 102 is installed above the polishing table 100, such that a polishing liquid Q is supplied onto the polishing pad 101 on the polishing table 100 by the polishing liquid supply nozzle 102. As illustrated in FIG. 15, an eddy current sensor 50 is embedded inside the polishing table 100.

Hereinafter, an eddy current sensor of the impedance type according to the present embodiment will be described specifically. The AC signal source 52 includes an oscillator 260 (see FIG. 16) with a fixed frequency approximately from 2 MHz to 30 MHz. The oscillator 260 is a quartz oscillator, for example. Additionally, a current $I_1$ flows through the eddy current sensor 50 due to an AC voltage supplied by the AC signal source 52. By causing a current to flow through the eddy current sensor 50 positioned near the metal film (or conductive film) mf, the magnetic flux links with the metal film (or conductive film) mf to form a mutual inductance M between the two, and an eddy current $I_2$ flows through the metal film (or conductive film) mf. Here, R1 is the equivalent resistance on the primary-side that includes the eddy current sensor, and L1 is the self-inductance on the primary side that similarly includes the eddy current sensor. On the metal film (or conductive film) mf side, R2 is the equivalent resistance corresponding to eddy current loss, and L2 is the self-inductance thereof. The impedance Z seen on the eddy current sensor side from terminals a and b of the AC signal source 52 changes depending on the magnitude of the eddy current loss formed in the metal film (or conductive film) mf.

FIG. 15 also illustrates the output signal processing circuit 34 of the eddy current sensor 50. As illustrated in FIG. 2, the polishing table 100 of the polishing apparatus is capable of rotating about an axis 170, as indicated by the arrow. The AC signal source 52 and the output signal processing circuit 54 are embedded inside the polishing table 100. The eddy current sensor 50 may also be integrated with the AC signal source 52 and the output signal processing circuit 54. An output signal 172 from the output signal processing circuit 54 enters the table spindle 100a of the polishing table 100 and passes through a rotary joint (not illustrated) provided on the axial end of the table spindle 100a, thereby connecting the output signal processing circuit 54 to an endpoint detection controller 246 by the output signal 172. Note that at least one of the AC signal source 52 and the output signal processing circuit 54 may also be disposed outside the polishing table 100.

Figure 16:
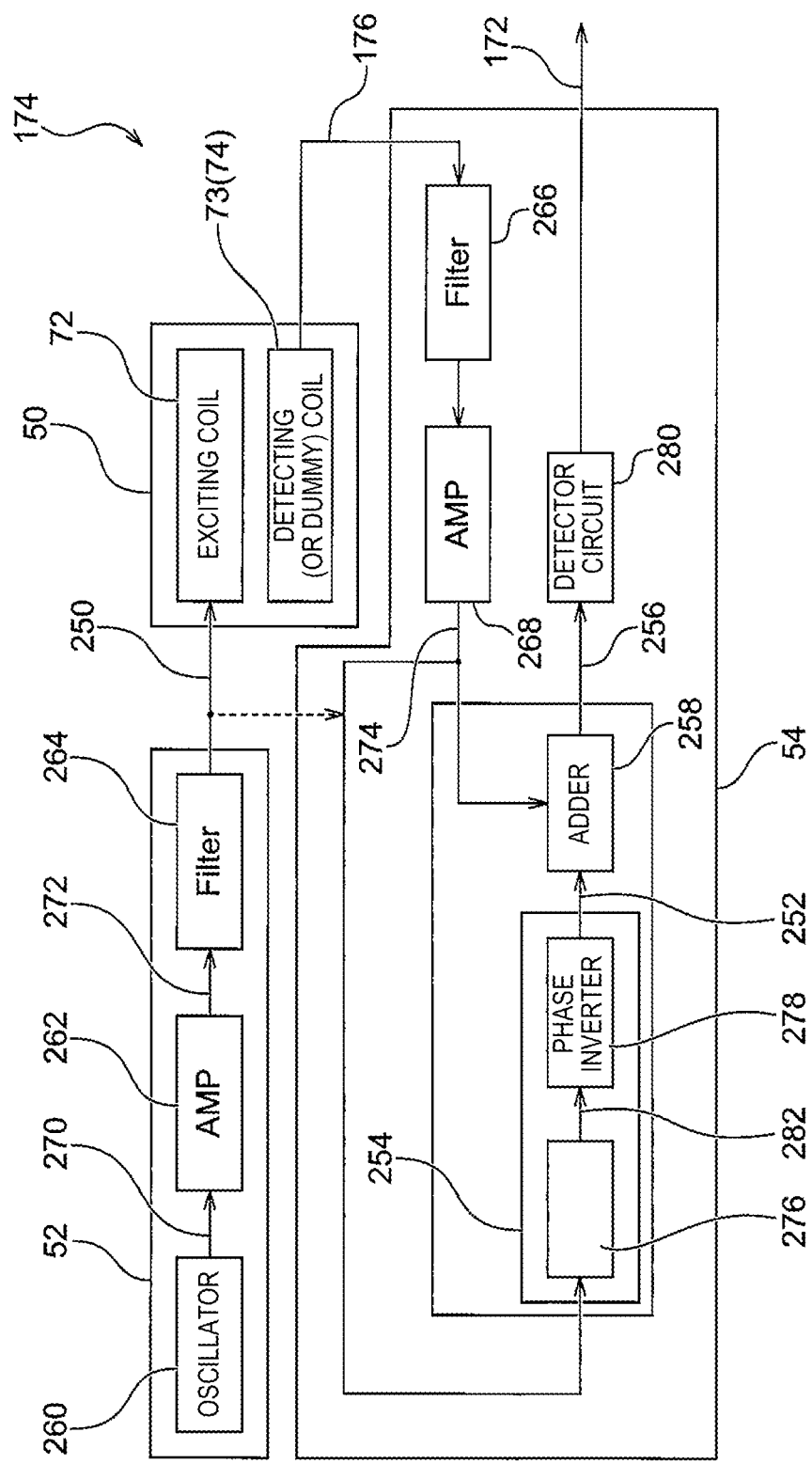
FIG. 16 is a block diagram illustrating an eddy current sensor assembly of the present embodiment.

FIG. 16 illustrates an eddy current sensor assembly 174. The eddy current sensor assembly 174 includes the eddy current sensor 50 and the output signal processing circuit 54 that processes an output signal 176 from the eddy current sensor 50. The eddy current sensor 50 includes an exciting coil 72 capable of accepting an excitation signal 250 as input and generating a magnetic field 308 (see FIG. 19A), and a detecting coil 73 capable of detecting the magnetic field 308 and outputting an output, signal 176 (detection signal). The output signal processing circuit. 54 includes a generator circuit 254 capable of generating a noise reduction signal 252 for reducing noise from the excitation, signal 250 or the output signal 176, and an adder circuit 258 capable of adding the noise reduction signal 252 generated in the generator circuit 254 to the output signal 176 and generating a noise-reduced signal 256 in which the noise included in the output signal 176 is reduced. In the present embodiment, the generator circuit 254 generates the noise reduction signal 252 from the output signal 176 of the detecting coil 73. In the present embodiment, the output signal 176 is subjected to signal processing by a filter 266 and an amplifier 268, The generator circuit 254 generates the noise reduction signal 252 from the processed output signal 176.

The AC signal source 52 may also include an amplifier 262 that amplifies an output signal 270 from the oscillator 260, and a filter 264 for reducing noise included in an output signal 272 from the amplifier 262, Because noise is also amplified by the amplifier 262, the filter 264 is installed downstream of the amplifier 262 to reduce the amplified noise. In the present embodiment, the output signal from the filter 264 is the excitation signal 250.

The eddy current sensor 50 includes an exciting coil 72 for forming an eddy current in the metal film (or conductive film) on the semiconductor wafer WH, and a detecting coil 73 that detects the generated eddy current. For example, the exciting coil 72 and the detecting coil 73 are disposed in the axial direction of a cylindrical ferrite core. The exciting coil 72 is connected to the AC signal source 52. The exciting coil 72 forms an eddy current in the metal film (or conductive film) mf on the semiconductor wafer WH disposed near the eddy current sensor 50 due to a magnetic field formed by the voltage supplied by the AC signal source 52. The detecting coil 73 is disposed on the upper side (the metal film (or conductive film) side) of the ferrite core, and detects the magnetic field generated by the eddy current formed in the metal film (or conductive film). The eddy current sensor 50 may also include a dummy coil 74 as described later.

The output signal 176 is input into the generator circuit 254 through the filter 266 and the amplifier 268 of the output signal processing circuit 54 An amplifier not illustrated is disposed upstream of the filter 266. The filter 266 is installed to reduce amplified noise. In only the amplifier not illustrated, the output signal 176 may be weak in some cases, and therefore the amplifier 268 is disposed downstream of the filter 266. An output signal 274 from the amplifier 268 is input into the generator circuit 254 and the adder circuit 258.

The generator circuit 254 generates the noise reduction signal 252. The noise reduction signal 252 is generated as follows. The generator circuit 254 includes a band-stop filter 276 and a phase inverter circuit 278. The hand-stop litter 276 attenuates to an extremely low level only frequency signals near a specific frequency signal (for example, 16 MHz) generated by the oscillator 260, The hand-stop filter 276 passes other frequency signals (that is, the noise signal) as-is. An output signal 282 from the band-stop filter 276 is sent to the phase inverter circuit 278, and the phase is inverted by the phase inverter circuit 278. Inverting the phase means advancing the phase 180 degrees.

The noise reduction signal 252 that is the output from the phase inverter circuit 278 is sent, to the adder circuit 258 and added to the output signal 274 in the adder circuit 258. The noise reduction signal 252 is a signal that cancels out only the noise component included in the output signal 274, The noise-reduced signal 256 that is the output from the adder circuit 258 is a signal in which the signals of frequencies other than the specific frequency generated by the oscillator 260 (that is, noise) is reduced. The noise-reduced signal 256 is sent to a detector circuit 280, The detector circuit 280 extracts the signal outputs X and Y, the phase, and the combined impedance Z (=X+iY) described above from the high-frequency signal. These are DC signals. The output from the detector circuit 280 is the output signal 172.

In the present embodiment, because the noise reduction signal 252 is added to the output signal 274 to generate the noise-reduced signal 256 in which the noise included in the output signal 274 is reduced, the S/N is improved over the technology of the related art. In the case of using the eddy current sensor 50 to measure film thickness, the detection accuracy of Cu wiring and the like is Improved over the technology of the related, art by reducing the influence of noise, and the performance of the eddy current sensor 50 is improved, FIG. 17 will, be used to further describe the processing performed in the band-stop filter 276, the phase inverter circuit 278, and the adder circuit 258. Hereinafter, the case of performing ideal no use canceling is assumed. The band-stop filter 276 outputs the output signal 282 containing only a noise component. To make the explanation dearer, let the output signal 282 be $Y1=A\sin(\omega t)$. Here, A is the amplitude of the noise (in units of millivolts (mv), for example), $\omega$ is the angular frequency of the noise (in units of radians per second (rad/s), for example), and t is time (seconds (s)).

The output signal 282 is converted to the noise reduction signal 252 by the phase inverter circuit 278. Letting Y2 be the noise reduction signal 252, then $Y2=-Y1$. Expressed differently, $Y2=A\sin(\omega t+\pi)$. On the other hand, the output signal 274 output by the detecting coil 73 contains a noise component $Y3=A\sin(\omega t)$ which is the same as the above noise component $Y1=A\sin(\omega t)$.

The adder circuit 258 adds the noise reduction signal 252 to the output Signal 274 and outputs the noise-reduced signal 256. Letting Y4 be the noise component included in the noise-reduced signal 256, then $Y4=Y3+Y2$, Because Y3 and Y2 have the same amplitude with the phase shifted 180 degrees, $Y4=0$. The noise-reduced signal 256 is a signal that does not include a noise component.

In FIG. 16, the noise reduction signal 252 is generated from the output of the detecting coil 73 or the dummy coil 74. The noise reduction signal 252 may also be generated from a source other than the output of the detecting coil 73 or the dummy coil 74. For example, the noise reduction signal 252 may also be generated from the output signal 270 of the oscillator 260 or from the excitation, signal 250. In FIG. 16, a plurality of amplifiers and filters are used, but the noise reduction signal 252 may also be generated from a signal upstream or downstream of an amplifier or a filter. Note that when generating the noise reduction signal 252 from the output of the detecting coil 73 or the dummy coil 74, it is preferable to generate the noise reduction signal 252 from the output of the detecting coil 73. Because the signal that is ultimately necessary is the output from the detecting coil 73, it is preferable to use the output of the detecting coil 73 to generate the noise reduction signal 252 to remove noise from the detecting coil 73.

Figure 18:
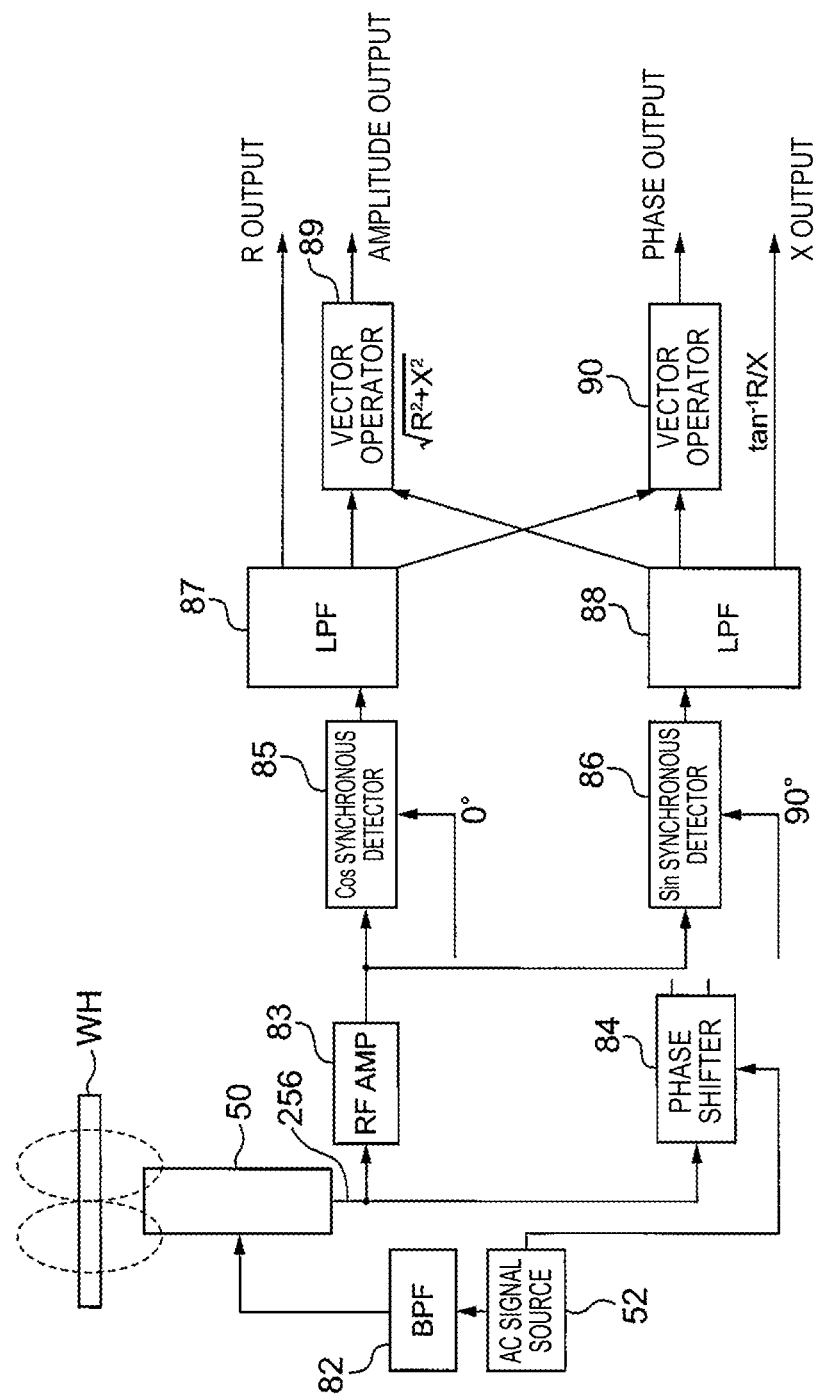
FIG. 18 is a block diagram illustrating a synchronous detector circuit of the eddy current sensor.

Returning to FIG. 16, the detector circuit 280 will be described. FIG. 18 is a block diagram illustrating a synchronous detector circuit 280 of an eddy current sensor. This diagram illustrates an example of a circuit for measuring the impedance Z seen on the eddy current sensor 50 side from the AC signal source 52 side. In the circuit for measuring the impedance Z illustrated in the diagram, a resistance component (R), a reactance component (X), an amplitude output (Z), and a phase output ($\tan^{-1}R/X$) associated with changes in film thickness can be extracted.

As described above, a signal source 52 supplies an AC signal to the eddy current sensor 50 disposed near the semiconductor wafer WH on which the metal film (or conductive film) mf to be detected is formed. The signal source 52 is an oscillator of fixed frequency containing a quartz oscillator. The signal source 52 supplies a voltage at a fixed frequency of 2 MHz, 8 MHz, or 16 MHz, for example. The AC voltage formed by the signal source 52 is supplied to the eddy current, sensor 50 through, a bandpass filter 82. A signal detected at the terminal of the eddy current, sensor 50 passes through a high-frequency amplifier 83 and a phase shift circuit 84, and the cos component and the sin component of the detection signal are extracted by a synchronous detection unit containing a cos synchronous detector circuit 85 and a sin synchronous detector circuit 86. Here, the oscillation signal formed by the signal source 52 is used by the phase shift circuit 84 to synthesize two signals of the in-phase component (0°) and the orthogonal component (90°) of the signal source 52, which are introduced into the cos synchronous detector circuit 85 and the sin synchronous detector circuit 86 respectively to perform the synchronous detection described above.

In the synchronously detected signals, an unwanted high-frequency component above the signal component is removed by low-pass filters 87 and 88 to extract the resistance component (R) output as the cos synchronous detection output and the reactance component (X) output as the sin synchronous detection output, respectively. Additionally, the amplitude output $(R^2+X^2)^{1/2}$ is obtained, from the resistance component (R) output and the reactance component (X) output by a vector operator circuit 89. Also, the phase output $(\tan^{-1} R/X)$ is obtained similarly from the resistance component output and the reactance component output by a vector operator circuit 90. Here, the main body of the measuring apparatus is provided with various fitters for removing noise, components' from sensor signals. A corresponding cutoff frequency is set for each of the various Oilers, and by setting the cutoff frequency of the Sow-pass filters in the range from 1 Hz to 10 Hz for example, the noise component mixed with the sensor signal being polished is removed, and the metal film (or conductive film) targeted for measurement can be measured accurately.

Next, an exemplary configuration of the coils in the eddy current sensor 50 according to the present embodiment will be described. FIG. 5 is a schematic diagram illustrating an exemplary configuration of a coil in the eddy current sensor 50 of the present embodiment. In the present embodiment, the eddy current sensor 50 includes an exciting coil 72 for forming an eddy current in the metal film (or conductive film), a detecting coil 73 for defecting the eddy current of the metal film (or conductive film), and a dummy coil 74, The eddy current sensor 50 includes the coils of the exciting coil 72, the detecting coil 73, and the dummy coil 74 in three layers wound around a ferrite core 71. Note that the structure of the eddy current sensor 50 is not limited to the structure illustrated in FIG. 5, and any structure may be adopted.

Here, the exciting coil 72 in the center is connected to the AC signal source 52. The exciting coil 72 forms an eddy current in the metal film (or conductive film) mf on the semiconductor wafer WH disposed near the eddy current sensor 50 due to a magnetic field formed by the voltage supplied by the AC signal source 52. The detecting coil 73 is disposed on the upper side (the metal film (or conductive film) side) of the ferrite core 71, and detects the magnetic field generated by the eddy current formed in the metal film (or conductive film). Additionally, the dummy coil 74 is disposed on the side of the exciting coil 72 opposite the detecting coil 73. The exciting coil 72 the detecting coil 73, and the detecting coil 73 are coils having the same number of turns (from 1 t to 20 t), for example. The reason for providing the dummy coil 74 is to enable the output from the output signal processing circuit 54 to be adjusted to zero when a metal film (or conductive film) is not present.

There are various possible methods of processing the output from the detecting coil 73 and the dummy coil 74. For example, as illustrated in FIG. 16, noise canceling and synchronous detection is performed on the output, from each of the detecting coil 73 and the dummy coil 74. Thereafter, the two obtained DC signals are subtracted. The film thickness can be measured on the basis of the subtraction result. The reason for subtracting is to cause the output from the detecting coil 73 to be zero when a metal film is not present, as described above.

Figure 19A:
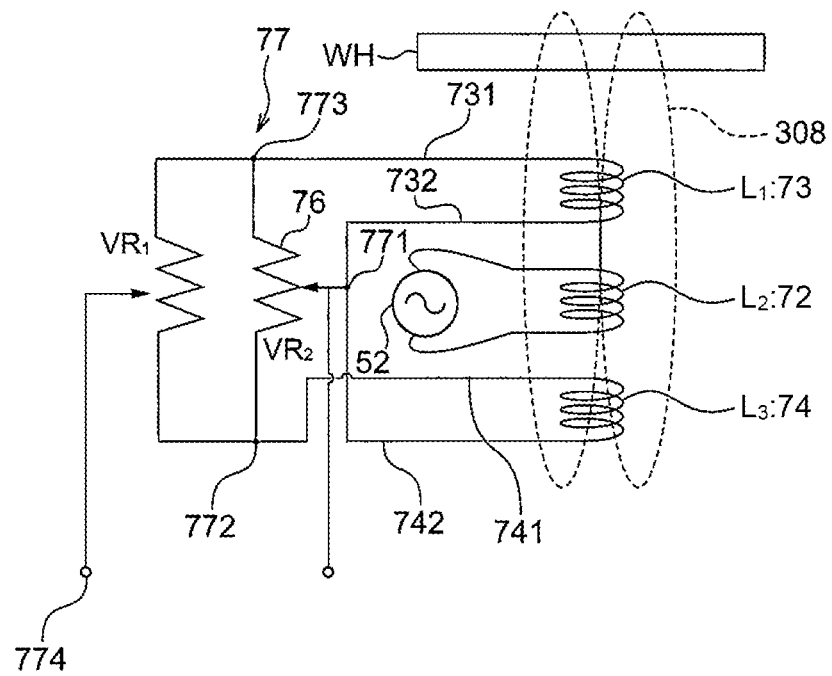
FIG. 19A is a schematic diagram illustrating an exemplary connection, of each coil in the eddy current sensor.
Figure 19B:
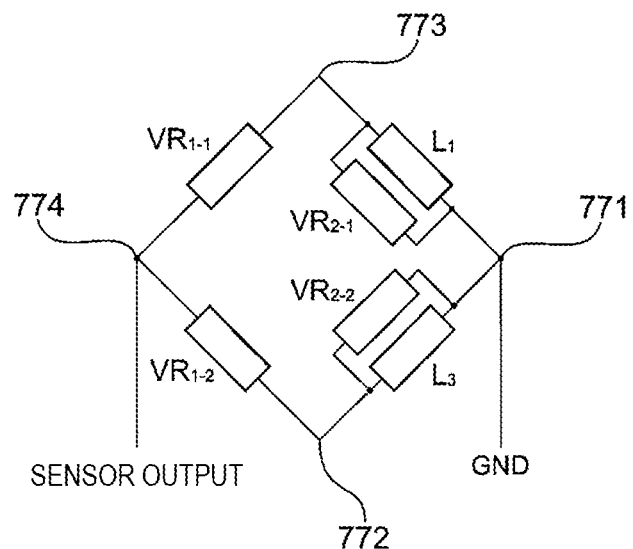
FIG. 19B is a schematic diagram illustrating an exemplary connection of each coil in the eddy current sensor.
Figure 19C:
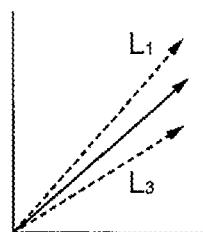
FIG. 19C is a schematic diagram illustrating an exemplary connection of each coil in the eddy current sensor.

FIGS. 19A, 19B, and 19C are schematic diagrams illustrating another exemplary connection of each coil in an eddy current sensor. In this example, a resistance bridge Circuit 77 is used. As illustrated in FIG. 19A, the detecting coil 73 and the dummy coil 74 are connected in reverse phase with each other. The detecting coil 73 and the dummy coil 74 form a reverse-phase series circuit, both ends of which are connected to a resistance bridge circuit 77 including a variable resistance 76.

Specifically, a signal line 731 of the detecting coil 73 is connected to a terminal 773 of the resistance bridge circuit 77, and a signal line 732 of the detecting coil 73 is connected to a terminal 771 of the resistance bridge circuit 77, A signal line 741 of the dummy coil 74 is connected to a terminal 772 of the resistance bridge circuit 77, and a signal line 742 of the dummy coil 74 is connected to the terminal 771 of the resistance bridge circuit 77. The terminal 771 is grounded. A terminal 774 of the resistance bridge circuit 77 is the sensor output. The detecting coil 73, the exciting coil 72, and the dummy cod 74 have inductances $L_1$, $L_2$, and $L_3$, respectively.

By connecting the exciting coil 72 to the AC signal source 32 and generating alternating flux, an eddy current is formed in the metal, film (or conductive film) mf disposed nearby. By adjusting the resistance value of the variable resistance 76, the output voltage of the series circuit containing the detecting coil 73 and the dummy coil 74 is adjustable so as to be zero when a metal film (or conductive film) is not present. The $L_1$ and $L_2$ signals are adjusted- to be in the same phase with each other by the variable resistance 76 ($VR_1$ and $VR_2$) inserted hi parallel with each of the detecting coil 73 and the dummy coil 74. In other words, in the equivalent circuit in FIG. 19B, variable resistances $VR_1(=VR_{1-1}+VR_{1-2})$ and $VR_2(=VR_{2-1}+VR_{2-2})$ are adjusted such that $$VR_{1-1} \times (VR_{2-2}+j\omega L_3) = VR_{1-2} \times (VR_{2-1}+j\omega L_1) \quad (1)$$

With this arrangement as illustrated in FIG. 19C, the $L_1$ and $L_3$ signals before adjustment (indicated by the dashed lines in the diagram) are set to signals having the same phase and the same amplitude (indicated by the solid line in the diagram).

Next, a different embodiment of the present invention will be described. FIGS. 8 and 9 are schematic diagrams illustrating an exemplary configuration of the eddy current sensor 50 and an exemplary connection of the exciting coil in the eddy current sensor according to the present embodiment. The eddy current sensor 50 disposed near the substrate on which a conductive film is formed includes a pot core 60 and six coils 860, 862, 864, 866, 868, and 870, The pot core 60 is a magnetic material and has a floor part 61a (bottom magnetic material), a magnetic core part 61b (central magnetic material) provided in the center of the bottom face part 61a, and a surrounding wall part 61c (peripheral magnetic material) provided at the periphery of the floor part 61a, The surrounding wall part 61c is a wall provided at the periphery of the floor part 61a so as to surround the magnetic core part 61b. In the present embodiment, the floor part 61a has a circular disc shape, the magnetic core part 61b has a solid columnar shape, and the surrounding wall part 61c has a cylindrical shape surrounding the floor part 61a.

Of the six coils 860, 862, 864, 866, 868, and 870, the coils 860 and 862 in the center are exciting coils connected to the AC signal, source 52. The exciting coils 860 and 862 form an eddy current in the metal film (or conductive film) mf on the semiconductor wafer WH disposed nearby due to a magnetic field, formed by the voltage supplied by the AC signal source 52. The detecting coils 864 and 866 are disposed on the metal film side of the exciting coils 860 and 862, and detect the magnetic field generated by the eddy current formed in the metal, film. The dummy coils 868 and 870 are disposed on the opposite side from the detecting coils 864 and 866 with the exciting coils 860 and 862 in between.

The exciting coil 860 is an Inner coil disposed on the outer periphery of the magnetic core part 61b, is capable of generating a magnetic field, and forms an eddy current in a conductive film. The exciting coil 862 is an outer toil disposed on the outer periphery of the surrounding wall part 61e, is capable of generating a magnetic field, and forms an eddy current hi a conductive film. The detecting coil 864 is disposed on the outer periphery of the magnetic core part 61b, is capable of detecting a magnetic field, and detects an eddy current formed in a conductive film. The detecting coil 866 is disposed on the outer periphery of the surrounding wall part 61c, is capable of detecting a magnetic field, and detects an eddy current formed in a conductive film.

The eddy current sensor includes the dummy coils 868 and 870 that detect an eddy current formed in a conductive film. The dummy coil 868 is disposed on the outer periphery of the magnetic core part 61b, and is capable of detecting a magnetic field. The dummy coil 870 is disposed on the outer periphery of the surrounding wall part 61c, and is capable of detecting a magnetic field. In the present, embodiment, the detecting coils and the dummy coils are disposed on the outer periphery of the floor part 61a and the outer periphery of the surrounding wall part 61c, hot the detecting coils and the dummy coils may al so be disposed on only one of either the outer periphery of the floor part 61a or the outer periphery of the surrounding wall part 61c.

The axial direction of the magnetic core part 61b is orthogonal to the conductive film on the substrate, the detecting coils 864 and 866, the exciting coils 860 and 862, and the dummy coils 868 and 870 are disposed at different positions m the axial direction of the magnetic core part 61b, and additionally, the detecting coils 864 and 866, the exciting coils 860 and 862, and the dummy coils 868 and 870 are disposed in the above order in the axial direction of the magnetic core part 61b proceeding from a position close to the conductive film on the substrate to a position farther away. A lead line (illustrated in FIG. 20) for connecting to the outside extends from each of the detecting coils 864 and 866, the exciting coils 860 and 862, and the dummy coils 868 and 870.

FIG. 8 is a cross-section of the eddy current sensor 50 in a plane passing through a central axis 872 of the magnetic core part 61b. The pot core 60 is a magnetic material and has a columnar floor part 61a, a columnar magnetic core part 61b provided in the center of the floor part 61a, and a cylindrical surrounding watt part 61c provided on the circumference of the floor part 61a. As one example of the dimensions of the pot core 60, the diameter LE1 of the floor part 61a is approximately from 1 cm to 5 cm, and the height LE2 of the eddy current sensor 50 is approximately from 1 cm to 5 cm. The outer diameter of the surrounding wall part 61c has the same cylindrical shape in the height direction in FIG. 8, but the outer diameter may also have a converging shape (tapered shape) that narrows in the direction going away from the floor part 61a, or in other words, narrows toward the tip.

The conducting wire used in the detecting coils 864 and 866, the exciting coils 860 and 862, and the dummy coils 868 and 870 is copper, Manganin wire, or nichrome wire. As a result of using Manganin wire or nichrome wire, there are fewer temperature changes due to electrical resistance and the like, and the temperature properties are improved.

In the present embodiment, wire rod is wrapped around the outside of the magnetic core part 61b and the outside of the surrounding wall part 61c made of ferrite or the like to form the exciting coils 860 and 862, and therefore the eddy current density flowing through the measurement target can be raised. Additionally, because the detecting coils 864 and 866 are also formed, on the outside of the magnetic core part 61b and the outside of the surrounding wall part 61c, the generated reverse magnetic field (interlinkage flux) can be collective efficiently.

To raise the eddy current density flowing through the measurement target, in the present embodiment, the exciting coil 860 and the exciting coil 862 are additionally connected, in parallel, as illustrated in FIG. 9. In other words, the inner coil and the outer coil are electrically connected in parallel. The reasons for connecting in parallel are as follows. When connected in parallel, the voltage that can be applied to the exciting coil 860 and the exciting coil 862 is increased and the current flowing through the exciting coil 860 and the exciting coil 862 is increased over the case of connecting in series. Consequently, the magnetic field is larger. Also, when connected in series, the inductance of the circuit increases, and the frequency of the circuit falls. This makes it difficult to apply the necessary high frequency to the exciting coils 860 and 862, The arrow 874 indicates the direction of current flowing through the exciting coil 860 and the exciting coil 862.

As illustrated in FIG. 9, the exciting coil 860 and the exciting coil 862 are connected such that the exciting coil 860 and the exciting coil 862 have the same magnetic field direction. In other words, current flows in different directions in the exciting coil 860 and the exciting coil 862. A magnetic field 876 is the magnetic field generated by the exciting coil 860 on the inner side, while a magnetic field 878 is the magnetic field generated by the exciting coil. 862 on the outer side. As illustrated in FIG. 9, the magnetic field directions of the exciting coil 860 and the exciting coil 862 are the same. In other words, the direction of the magnetic field that the inner coil generates inside the magnetic core part. 61b is the same as the direction of the magnetic field that the outer coil generates inside the magnetic core part 61b.

Because the magnetic field 876 and the magnetic field 878 illustrated in the region 880 have the same orientation, the two magnetic fields are added together and become larger. Compared to the case, where only the magnetic field 876 generated by the exciting coil 860 exists like in the related art, in the present embodiment, the magnetic field is larger by the extent of the magnetic field 878 generated by the exciting coil 862.

The detecting coil 864, the exciting coil 860, and the dummy cod 868 correspond to the detecting coil 73, the exciting coil 72, and the dummy coil 74 of FIG. 5. The detecting coil 866, the exciting coil 862, and the dummy coil 870 correspond to the detecting coil 73, the exciting coil 72, and the dummy coil 74 of FIG. 5. In other words, the eddy current sensor of FIG. 10 has a structure in which two of the eddy current sensor in FIG. 5 are disposed concentrically. Accordingly, the output signal processing circuit 54 corresponding to the eddy current sensor of FIG. 10 preferably includes two of the output signal processing circuit 54 illustrated hi FIG. 16.

Figure 20:
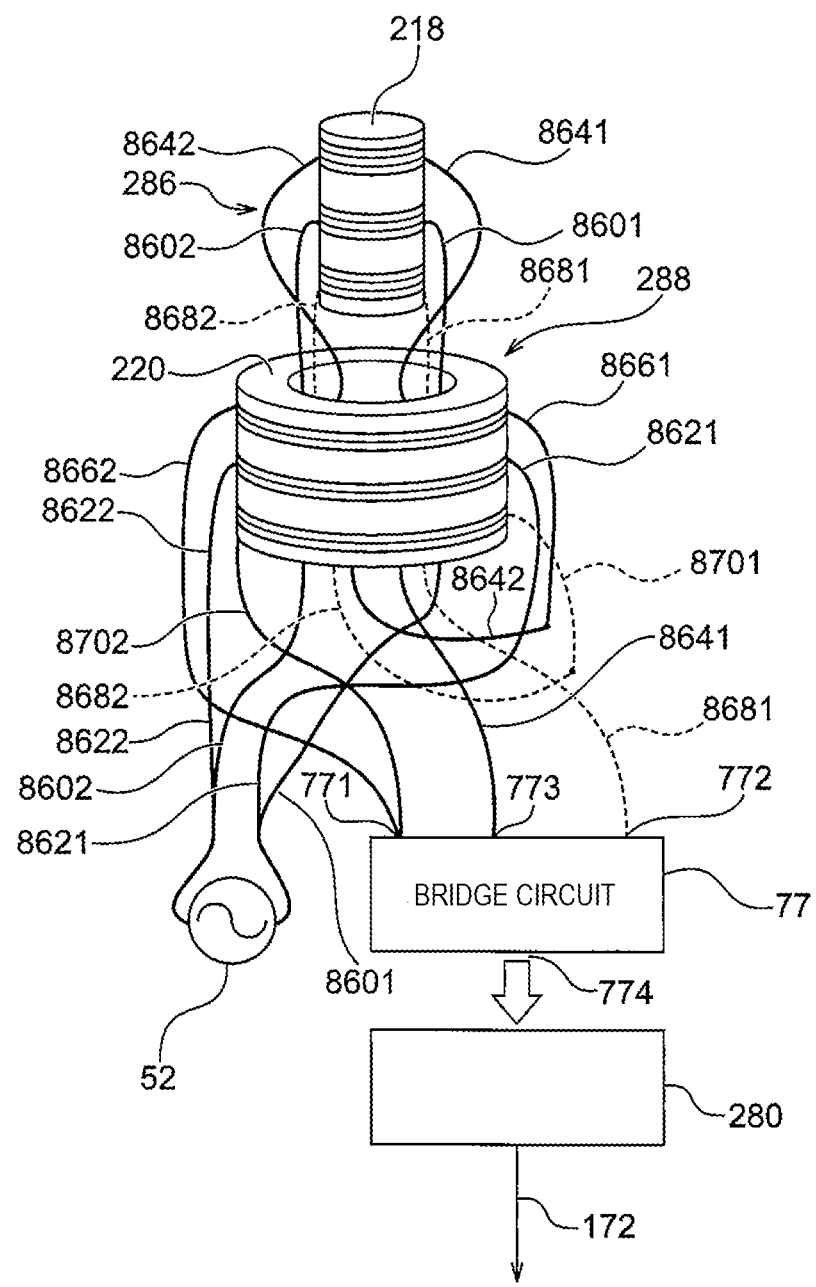
FIG. 20 is a perspective view of the eddy current sensor illustrated in FIG. 8 and a block diagram illustrating an exemplary connection.
Figure 21:
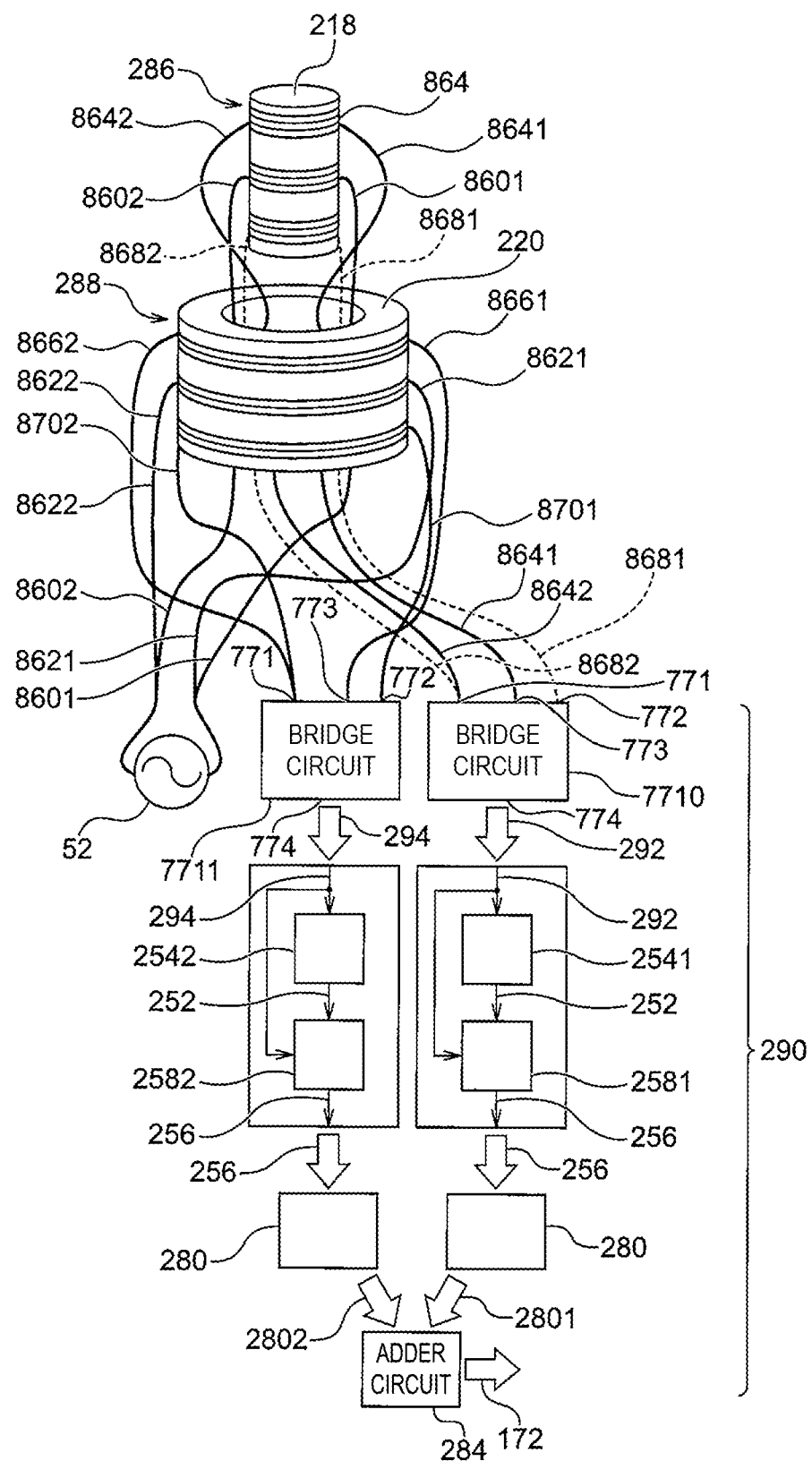
FIG. 21 is a perspective view of the eddy current sensor illustrated in FIG. 8 and a block diagram illustrating an exemplary connection.

An example of the output signal processing circuit 54 corresponding to the eddy-current sensor of FIG. 10 is illustrated in FIGS. 20 and 21, FIG. 20 is a comparative example that does not include a noise canceling function. FIG. 21 includes a noise canceling function. FIGS. 20 and 21 illustrate a perspective view of the eddy current sensor illustrated in FIG. 8, In FIGS. 20 and 21, a top face 218 is illustrated above a top face 220 for easier understanding, but the top lace 218 and the top lace 220 are in the same horizontal plane as illustrated in FIG. 8. In FIGS. 20 and 21, there are two coil assemblies, but there may also be three or more coil assemblies. In the case where there are two or more coil assemblies, the measurement accuracy (S/N ratio) is improved because of the increased number of film thickness measurements compared to the case of a single coil assembly.

First, the configuration of the comparative example will be described. In the comparative example, a detecting coil 864 of an inner eddy current sensor 286 and a detecting coil 866 of an outer eddy current sensor 288 are connected in series. A dummy coil 868 of the tuner eddy current sensor 286 and a dummy coil 870 of the outer eddy current sensor 288 are connected in series. An exciting coil 860 and an exciting coil 862 of the inner and outer eddy current sensors are connected in parallel to the signal source 52.

The specific connections are as follows. In the inner eddy current sensor 286, the detecting coil 864 includes signal lines 8641 and 8642. The exciting coil. 860 includes signal Hues 8601 and 8602, The dummy coil 868 includes signal lines 8681 and 8682. In the outer eddy current sensor 288, the detecting coil 866 includes signal lines 8661 and 8662, The exciting coil 862 includes signal, lines 8621 and 8622. The dummy coil 870 includes signal lines 8701 and 8702.

The signal line 8641 of the detecting coil 864 of the inner eddy current sensor 286 is connected to the terminal 773 of the resistance bridge circuit 77. The signal line 8642 of the detecting coil 864 is connected to the signal line 8661 of the detecting coil 866 of the outer eddy current sensor 288. The signal line 8662 of the detecting coil 866 is connected to the terminal 771 of the resistance bridge circuit 77. The signal line 8681 of the dummy coil. 868 of the inner eddy current sensor 286 is connected to the terminal 772 of the resistance bridge circuit 77. The signal line 8642 of the dummy coil 868 is connected to the signal line 8701 of the dummy coil 870 of the outer eddy current sensor 288. The signal line 8702 of the dummy coil 870 is connected to the terminal 771 of the resistance bridge circuit 77.

In the comparative example, the output of detecting coil 864 of the inner eddy current sensor 286 and the output of the detecting coil 866 of the outer eddy current sensor 288 are in series, and consequently there is an effect of increased output compared to the case of a single detecting coil. The terminal 774 of the resistance bridge circuit 77 is connected to the detector circuit 280. The output of the detector circuit 280 is the output signal 172, and is connected to the endpoint detection controller 246 illustrated in FIG. 15.

The embodiment illustrated in FIG. 21 includes a noise canceling function, and therefore has the advantage of an improved S/N over the comparative example. The present embodiment uses a separate resistance bridge circuit 77 for each of the inner eddy current sensor 286 and the outer eddy current sensor 288. Additionally, because a separate output signal processing circuit 54 (generator circuit 254 and adder circuit 258) is provided downstream of each resistance bridge circuit 77, the S/N is improved.

The generator circuit 254 for the inner eddy current sensor 286 is a generator circuit 2541, while the generator circuit 254 for the outer eddy current sensor 288 is a generator circuit 2542, The generator circuit 2541 and the generator circuit 2542 have the same configuration as the generator circuit 254. The filter 266 and the amplifier 268 are provided upstream of the generator circuit 2541 and the generator circuit 2542, similarly to FIG. 16. The adder circuit 258 for the inner eddy current sensor 286 is an adder circuit 2581, while the adder circuit 258 for the outer eddy current sensor 288 is an adder circuit 2582. The adder circuit 2581 and the adder circuit 2582 have the same configuration as the adder circuit 258.

The noise-reduced signals 256 obtained by the inner eddy current sensor 286 and the outer eddy current sensor 288 are sent to the detector circuit 280, and the outputs of the two bridge circuits 7710 and 7711 are in series. Thereafter, the signals are added together in an adder circuit 284. Adding the signals together improves the sensitivity.

The configuration of the present embodiment will be described specifically. The inner eddy current sensor 286 includes the exciting coil 860 (First exciting coil) that accepts excitation signals 8601 and 8602 from the signal source 52 as input and is capable of generating the first magnetic field 876 (see FIG. 10), the detecting coil 864 (first detecting coil) capable of detecting the first magnetic field 876 and outputting a signal 8641 (first detection signal), and the dummy coil 868 (first dummy coil) capable of detecting the first magnetic field and outputting a signal 8681 (first dummy signal). Note that in this specification, a signal line and a signal that flows on that signal line may be denoted with the same reference sign in some cases, such as the signal line 8641 and the signal 8641, for example.

An output signal processing circuit 290 of the present embodiment that processes the signal 8641 and the signal 8681 output by the inner eddy current sensor 286 includes a first resistance bridge circuit 7710 capable of outputting the difference between the signal 8641 and the signal 8681 as a first difference signal 292. The output signal processing circuit 290 includes the generator circuit 2541 (first generator circuit) capable of generating a first noise reduction signal 252 for reducing noise from any of the excitation signal 8601, the signal 8641 (first detection signal), the signal 8681 (first dummy signal), and the first difference signal 292. In the present, embodiment, the first noise reduction signal 252 for reducing noise is generated from the first difference signal 292 that is the output from the terminal 774.

The output signal processing circuit 290 further includes a first adder circuit 2581 capable of adding the first noise reduction signal 252 generated in the generator circuit 2541 to the first difference signal. 292, and thereby generating a first noise-reduced signal 256 in which the noise included in the first difference signal 292 is reduced.

The outer eddy current sensor 288 includes the exciting coil 862 (second exciting coil) that accepts an excitation signal 8621 as input and is capable of generating the second magnetic field 878 (see FIG. 10), the detecting coil 866 (second detecting coil) capable of detecting the first magnetic field 876 and the second magnetic field 878 and outputting a signal 8661 (second detection signal), and the dummy coil 870 (second dummy coil) capable of detecting the first magnetic field 876 and the second magnetic field 878 and outputting a signal 8701 (second dummy signal).

The detecting coil 864 of the inner eddy current sensor 286 is capable of detecting the first magnetic field 876 and the second magnetic field 878 and outputting the signal 8641. The dummy cod 868 is capable of detecting the first magnetic field 876 and the second magnetic field 878 and outputting the first dummy signal. The output signal processing circuit 290 includes a second resistance bridge circuit 7711 capable of outputting the difference between the signal 8661 and the signal 8701 as a second difference signal 294.

Here, the meaning of the first and second detecting coils detecting the first magnetic field 876 and the second magnetic field 878 will be described. The detecting coil 864 of the inner eddy current sensor 286 detects the film thickness as follows. First, an eddy current is induced on the metal surface by the high-frequency magnetic Held generated by the exciting coil. In other words, the state of the magnetic field is different depending on whether the wafer (conductive film) is nearby or not. An exciting coil capable of generating a magnetic field on the metal surface by applying a high frequency (2 MHz or higher) to the exciting coil is brought close to the conductive metal surface. The high-frequency magnetic field generates current in eddies on the metal surface. The eddy current flows in a direction that partially cancels out the magnetic field. The detecting coil of the eddy current sensor detects the magnetic field that is partially canceled out. The eddy current sensor uses the correlation between the magnitude of the eddy current and the thickness of the film to measure the thickness of the conductive film, on the metal.

"Detecting the first magnetic field and the second magnetic field" refers to "defecting the combined magnetic field of the first magnetic field and the second magnetic field", and the combined magnetic field is also different depending on whether the wafer (conductive film) is present or not, "The first and second detecting coils detect the first and second magnetic fields" means that "an eddy current is generated on the metal surface by the combined magnetic field of the first and second magnetic fields, the combined magnetic field is partially canceled out by the generated eddy current, and the partially canceled, out magnetic field is detected".

Returning to the description of the outer eddy current sensor 288, the output signal processing circuit 290 includes the generator circuit 2542 (second generator circuit) capable of generating a second noise reduction signal 252 for reducing noise from any of the excitation signal 8621, the signal 8661 (second detection signal), the signal 8701 (second dummy signal), and the second difference signal 294. In the present embodiment, the second noise reduction signal 252 for reducing noise is generated from the second difference signal 294 that is the output from the terminal 772.

The output signal processing circuit 290 includes a second adder circuit 2582 capable of adding the second noise reduction signal 252 generated in the generator circuit 2542 to the second difference signal 294 and thereby generating s second noise-reduced signal 256 in which the noise included in the second difference signal 294 is reduced, and a third adder circuit 284 capable of adding together the first noise-reduced signal 256 and the second noise-reduced signal 256.

According to the present embodiment, because the first difference signal and the second difference signal are added together, the output signal from the eddy current sensor is larger than the related art and the accuracy of Him thickness measurement is improved.

Figure 22:
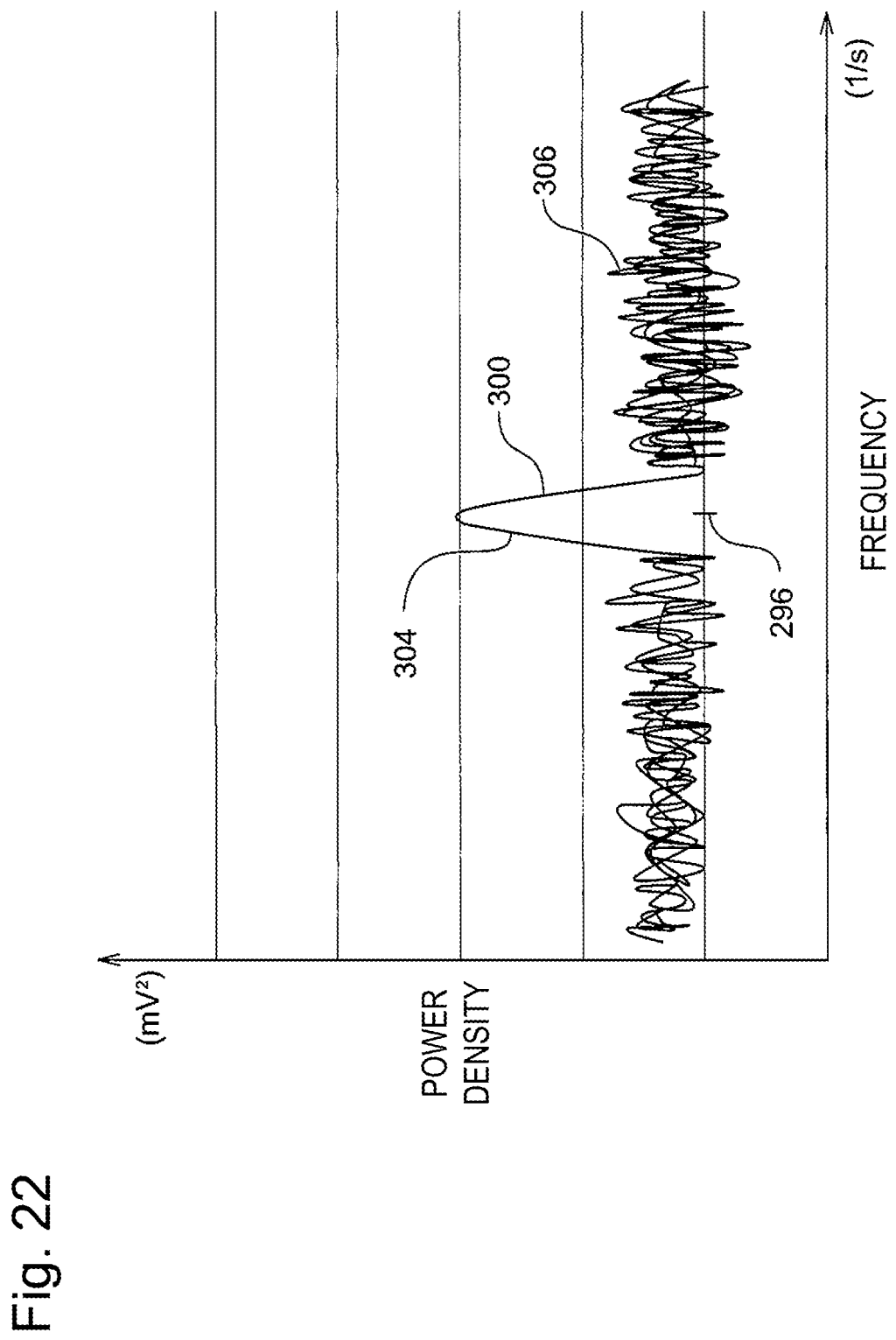
FIG. 22 is a spectrum illustrating an intensity distribution of noise and signal contained in an output signal from a detecting coil with respect to frequency.
Figure 23:
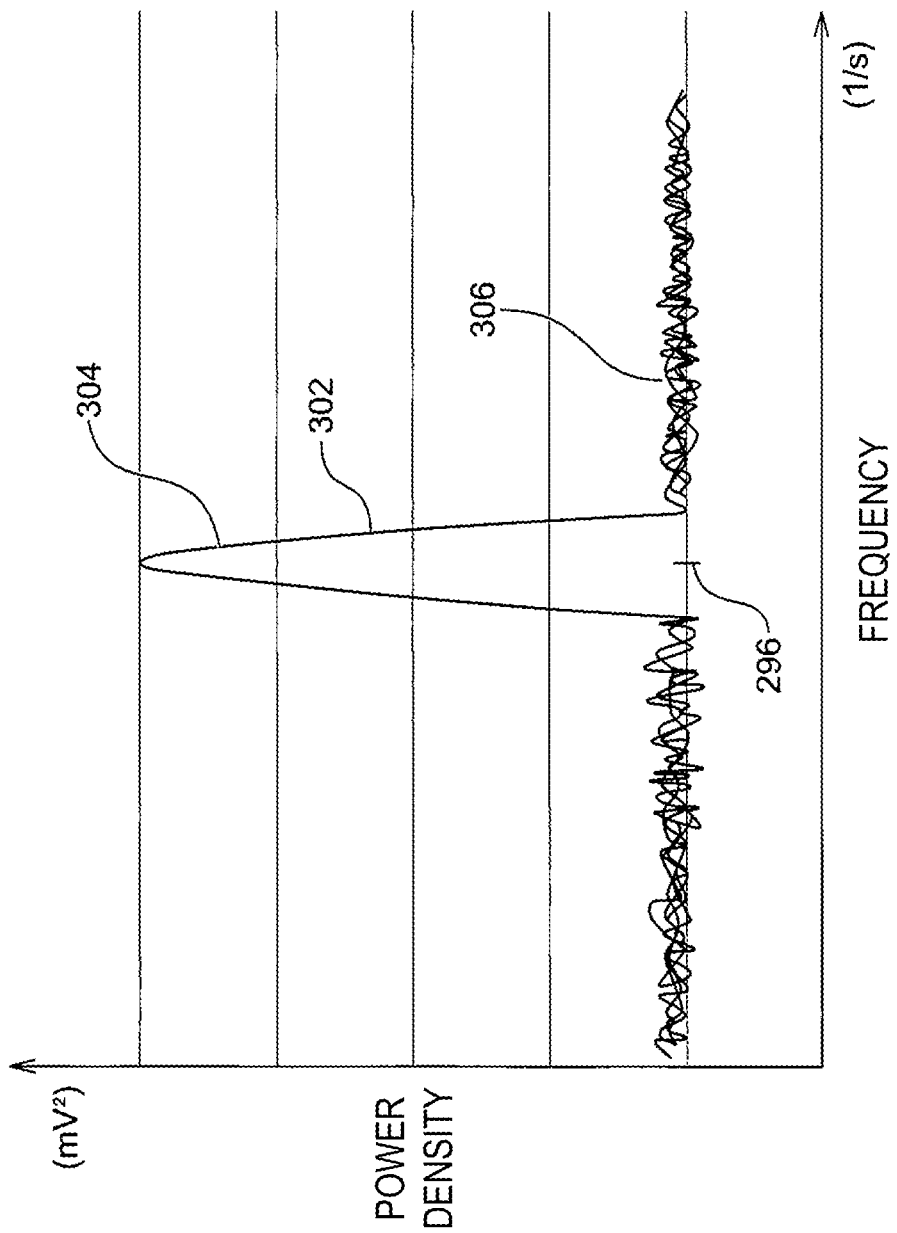
FIG. 23 is a spectrum illustrating the intensity distribution of noise and signal contained in the output signal from the detecting coil with respect to frequency.

A comparison of the effects of the embodiment in FIG. 21 to the effects of an embodiment having a single eddy current sensor and lacking a noise canceling function is illustrated conceptually in FIGS. 22 and 23. Each of FIGS. 22 and 23 is a spectrum illustrating an intensity distribution of noise and signal contained in an output signal from a detecting coil with respect to frequency. FIG. 22 illustrates the spectrum of the output 300 of an eddy current sensor in an embodiment (not illustrated) having a single eddy current sensor and lacking a noise canceling function. FIG. 23 is the spectrum of the output 302 obtained by adding together the outputs from two eddy current sensors after a noise canceling process in the embodiment illustrated in FIG. 21 that has two eddy current sensors and also includes a noise canceling function. In FIGS. 22 and 23, the horizontal axis is frequency (in units of frequency (1/s)), and the vertical axis is the power density (square of the amplitude) at each frequency (in units of millivolts squared). The outputs 300 and 302 contain a signal 304 that exists in the vicinity of the frequency 296, and noise 306 that exists outside the vicinity of the frequency 296.

Comparing FIGS. 22 and 23 demonstrates that the magnitude of the output 302 obtained by adding together the signals 304 from the two eddy current sensors in the vicinity of the frequency 296 included in the excitation signal 8603 is on the order of double the magnitude of the signal 304 from the single eddy current sensor. The magnitude of the noise 306 included in the output 302 from the two eddy current sensors outside the vicinity of the frequency 296 included in the excitation signal 8601 is strongly reduced compared to the magnitude of the noise 306 included in the output 300 from the single eddy current sensor.

Note that as illustrated in FIG. 21, the first noise-reduced signal 256 and the second noise-reduced signal 256 are added together by the third adder circuit 284 after passing through respective detector circuits 280 and being converted to DC signals (a first noise-reduced signal 2801 and a second noise-reduced signal 2802). Comparing FIGS. 20 and 21 demon states that the embodiment of FIG. 21 is the embodiment of FIG. 20 with the addition of the first resistance, bridge circuit 7710, the first generator circuit 2541, the second generator circuit 2542, the first adder circuit 2581, the second adder circuit 2582, the detector circuit 280 for the inner eddy current sensor 286, and the third adder circuit 284.

From the embodiment of FIG. 21, an embodiment without a noise canceling circuit is also possible. In other words, the outputs of the two eddy current sensors 286 and 288 are respectively processed, by the bridge circuits 7710 and 7711, respectively converted to DC signals by the detector circuits 280 for respectively processed signals, and then, added together by the third adder circuit 284.

Specifically, the output signal processing circuit in this embodiment includes the first resistance bridge circuit. 7710 capable of outputting the difference between the signal 8641 (first detection signal) and the signal. 8681 (first dummy signal) as a first difference signal 292, the second resistance bridge circuit 7711 capable of outputting the difference between the signal. 8661 (second detection signal) and the signal 8701 (second dummy signal) as a second difference signal 294, and the third adder circuit 284 capable of adding together the first difference signal 292 and the second difference signal 294 via the detector circuits 280.

In FIG. 21, the signals are added together by the third adder circuit 284 after DC conversion by the detector circuits 280, but the DC conversion by the detector circuits 280 does not have to be performed, in other words, AC signals may be added together. However, adding together the signals after performing DC conversion has the advantages described below.

Compared to FIG. 20, FIG. 21 has the following advantages. In FIG. 20, the outputs of the detecting coil 864 and the detecting coil 866 are added together by directly coupling the signal line 8642 and the signal line 8661. These are high-frequency signals, and high-frequency signals may cancel each other out when added together. As a result, the output signals may not be utilized effectively in some cases, in FIG. 21, the signals are added together by the third adder circuit 284 after performing DC conversion by the detector circuits 280, Because DC signals are added together, the signals do not cancel each other out, and the output signal level increases.

In the embodiment of FIG. 21, the third adder circuit 284 adds together the output of the inner eddy current sensor 286 and the output of the outer eddy current sensor 288, but the third adder circuit 284 may also subtract the output of the outer eddy current sensor 288 from the output of the inner eddy current sensor 286. This case has the following advantages. The inner eddy current sensor 286 has a small diameter and therefore is susceptible to the influence of a conductive film in a small region. As a result, the film thickness in a small region can be measured. The outer eddy current sensor 288 has a large diameter and therefore is susceptible to the Influence of a conductive film in a large region. As a result, the film thickness in a large region can be measured. If the output of the outer eddy current sensor 288 is subtracted from the output, of the inner eddy current sensor 286, the influence of a conductive film in a large region can be removed from the output of the inner eddy current sensor 286. As a result, the film thickness in a small region can be measured more accurately. The term "adding together" in the third adder circuit 284 illustrated in FIG. 21 encompasses "addition" and "subtraction" in this sense.

Note that in the eddy current sensor illustrated in FIG. 8, the inner eddy current sensor 286 and the outer eddy current sensor 288 are integrated, but the inner eddy current sensor 286 and the outer eddy current sensor 288 may also be separate and independent eddy current sensors. Methods of producing the integrated eddy current sensor illustrated in FIG. 8 include (1) a method of forming the floor part 61a, the magnetic core part 61b, and the surrounding wall part 61c as a single body by cutting, (2) a method of producing the floor part 61a, the magnetic core part 61b, and the surrounding wall part 61c separately, and after winding the coils, joining and integrating the three pieces by brazing or the like.

The band-stop filter 276, the phase inverter circuit 278, and the adder circuit 258 can be achieved by a digital signal processor (DSP). A digital signal processor is a microprocessor suitable for digital signal processing. The band-stop filter 276, the phase inverter circuit 278, and the adder circuit 258 may also be analog circuits. The digital signal processor includes an upstream analog-to-digital converter circuit (that is, an electronic circuit that converts an analog electrical signal to a digital electrical signal; also referred to as an A/D converter circuit or an ADC) not illustrated. The digital signal processor includes a downstream digital-to-analog converter circuit (that is, an electronic circuit that converts a digital electrical signal to an analog electrical signal; also referred to as a D/A converter circuit or a DAC) not illustrated. The detector circuits 280 downstream of the adder circuit 258 can also be achieved by a digital signal processor.

Figure 17:
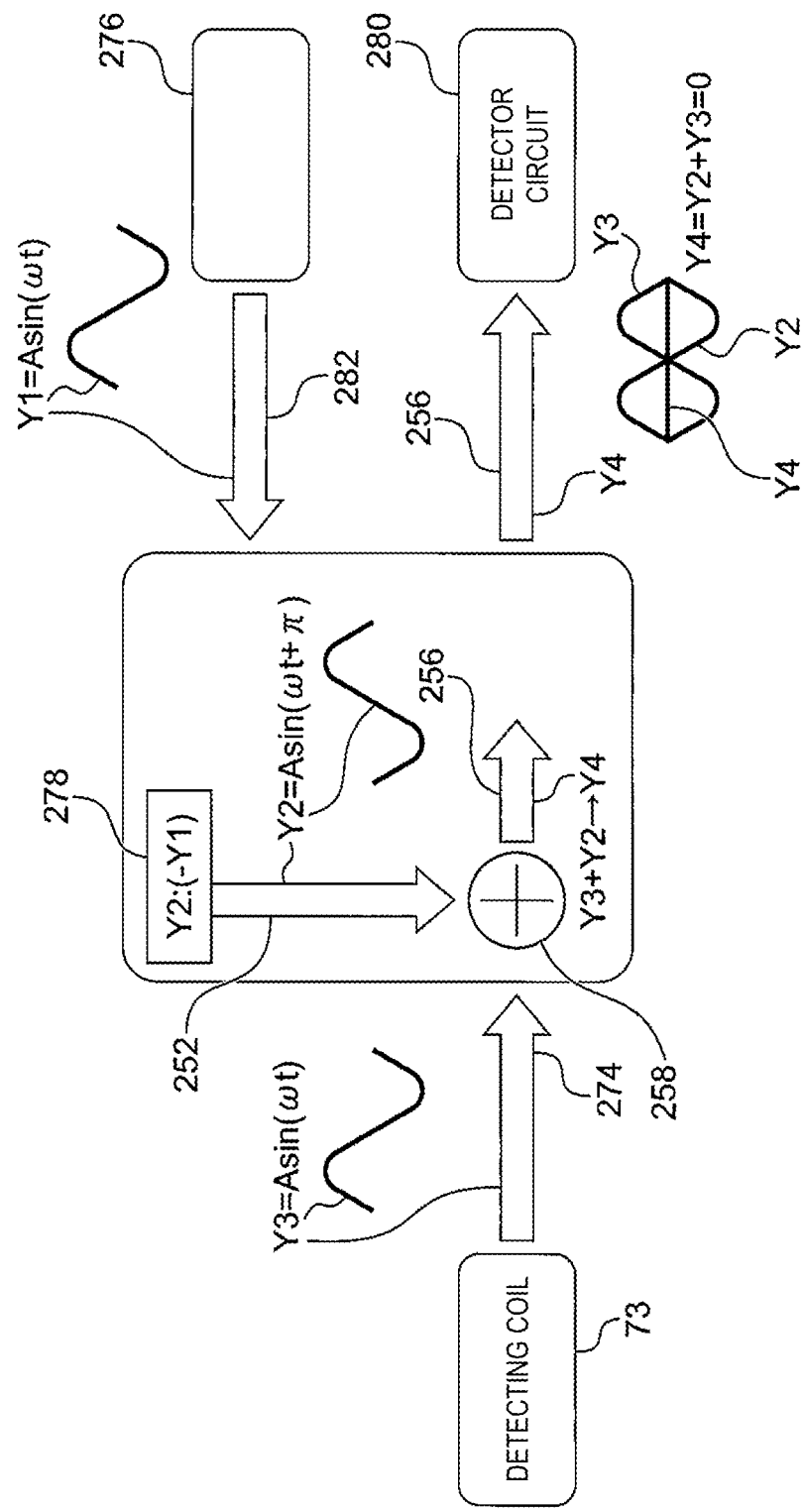
FIG. 17 is a block diagram illustrating the basic principles of noise canceling according to the present embodiment.

Note that in the description of FIG. 17, the noise component Y1 and the noise component Y3 are assumed to be the same in the magnitude of the amplitude A to simplify the description, but the noise component. Y1 and the noise component Y3 may be different from the magnitude of the amplitude A in some cases. For example, in some cases, the noise component Y1 is generated from the excitation signal 250 while the noise component Y3 is the noise component included in the detecting coil 73. At this time, a process of matching the magnitude of the amplitude A is performed in the DSP. In the description of FIG. 17, the noise component Y1 and the noise component Y3 are assumed to have the same phase to simplify the description, bat in the case of a large phase misalignment, a process of aligning the phase is performed in the DSP.

Note that in the adder circuit 258 of FIG. 16, the output signal 274 is added together with a signal of inverted phase relative to the output signal 274, The method of noise canceling is not limited to the above, and any method capable of noise canceling can be adopted. For example, there is a method of subtracting signals without inverting the phase. In other words, the phase inverter circuit 278 is removed, and the output signal of the hand-stop filter 276 is subtracted from the output signal 274 in the adder circuit 258. With this method, noise canceling similar to the case of using the phase Inverter circuit 278 is possible.

Consequently, "adding a signal of inverted phase" and "subtracting a signal of non-inverted phase" have the same effect from the viewpoint of noise canceling. In this specification, the term "adding together" encompasses "addition" and "subtraction" in this sense.

Note that by disposing a temperature sensor inside the eddy current sensor 50, temperature changes Inside the eddy current sensor 50 can be detected, and the output of the detecting coil 73 cart be corrected. The correction method is as follows, for example. Before polishing the semiconductor wafer WH, the relationship between the temperature of the eddy current sensor 50 and the output of the detecting coil 73 is measured, and the relationship is created as a correction table. The correction table may have any of various possible configurations. For example, a coefficient by which to multiply the output of the detecting coil 73 for each temperature of the eddy current sensor 50 is created as fee correction table. Alternatively, a polynomial expressing correction coefficients as a function of temperature is created as the correction table (a table displaying the coefficient of each order in the polynomial). Correcting according to temperature makes it possible to accommodate temperature changes. The film thickness measurement accuracy can be raised, and the accuracy of detecting the end of polishing can be improved.

Next, a method of processing the output signal from the eddy current sensor will be described. In FIG. 16, the exciting coil 72 accepts the excitation signal 250 as input and generates a magnetic field. The detecting coil 73 detects the magnetic field and outputs the output signal 176. The generator circuit 254 generates the noise reduction signal 252 for reducing noise from the excitation signal 250 or the output signal 176, The adder circuit 258 adds the generated noise reduction signal 252 to the output signal 176 to generate the noise-reduced signal 256 in which the noise included in the output signal 176 is reduced.

Next, a different method of processing the output signal from the eddy current sensor will be described. In FIG. 21, the exciting coil 860 (first exciting coil) accepts the excitation signal 250 as input and generates the first magnetic field 876, The detecting coil 864 (first detecting coil) detects the first magnetic field 876 (see FIG. 10) and outputs the signal 8641 (first detection signal). The dummy coil 868 (first dummy coil) detects the first magnetic field 876 and outputs the signal 8681 (first dummy signal).

In the eddy current sensor output signal processing method that processes the signal 8641 and the signal 8681 output by the eddy current sensor 286, the first resistance bridge circuit 7710 outputs the difference between the signal 8641 and the signal 8681 as the first difference signal 292. The generator circuit 2541 generates the first noise reduction signal 252 for reducing noise from any of the excitation signal 250, the signal 8641, the signal 8681, and the first difference signal 292, In FIG. 21, the generator circuit 2541 generates the first noise reduction signal 252 for reducing noise from the first difference signal 292. The first adder circuit 2581 adds the generated first noise reduction signal 252 to the first difference signal 292 to generate the first noise-reduced signal 2801 in which the noise included in the first difference signal 292 is reduced.

Next, a different method of processing the output signal from the eddy current sensor will be described. In FIG. 21, the exciting coil. 862 (second exciting cod) accepts the excitation signal 250 as input, and generates the second, magnetic field 878 (see FIG. 10). The detecting coil 866 (second detecting coil) detects the first magnetic field 876 and the second magnetic field 878, and outputs the signal 8661 (second detection signal). The dummy coil 870 (second dummy coil) detects the first magnetic field 876 and the second magnetic field 878, and outputs the signal 8701 (second dummy signal).

The detecting coil 864 detects the first magnetic field 876 and the second magnetic field 878, and outputs the signal 8641 (first detection signal). The dummy coil 868 detects the first magnetic field 876 and the second magnetic field 878, and outputs the signal 8681 (first dummy signal). The second resistance bridge circuit 7711 outputs the difference between the signal 8661 and the signal 8701 as the second, difference signal 294. The generator circuit 2542 generates the second noise reduction signal 252 for reducing noise from any of the excitation signal 250, the signal 8661, the signal 8701, and the second difference Signal 294, The second adder circuit 2582 adds the generated second noise reduction signal 252 to the second difference signal 294 to generate the second noise-reduced signal 2802 in which the noise included in the second difference signal 294 is reduced. The third adder circuit 284 adds together the first noise-reduced signal 281 and the second noise-reduced signal 2802.

Next, a different method of processing the output signal from the eddy current sensor will be described. The present embodiment is obtained by removing the noise canceling, circuit from the embodiment in FIG. 21. The outputs from the two eddy current sensors 286 and 288 are processed by the bridge circuits 7710 and 7711, respectively. Thereafter, the signals are converted to DC signals by the detector circuit 280 and then added together in the third adder circuit 284. Specifically, the exciting coils 860 and 862 accept the excitation, signal 250 as input and generate the first magnetic field 876 and the second magnetic field 878, respectively. The detecting coils 864 and 866 (first and second detecting coils) detect the first magnetic field 876 and the second magnetic field 878, and output the signals 8641 and 8661 (first and second detection signals), respectively. The dummy coils 868 and 870 (first and second dummy coils) detect the first magnetic field 876 and the second magnetic field 878, and output the signals 8681 and 8701 (first and second dummy signals), respectively.

In the output, signal processing method of the present embodiment, the signals 8641 and 8661 and the signals 8681 and 8701 output by the eddy current sensors 286 and 288 are processed. The first resistance bridge circuit 7710 outputs the difference between the signal 8641 (first detection signal) and the signal 8681 (first dummy signal) as the first difference signal 292. The second resistance bridge circuit 7711 outputs the difference between the signal 8661 (second detection signal) and the signal 8701 (second dummy signal) as the second difference signal 294. The first difference signal 292 and the second difference signal 294 are converted to DC signals in the detector circuit 280 and then added together in the third adder circuit 284.

A method of controlling each unit of the polishing apparatus on the basis of the film thickness obtained by the eddy current sensor 50 is described hereinafter. As illustrated in FIG. 15, the eddy current sensor 50 is connected to an endpoint, detection controller 246, and the endpoint detection controller 246 is connected to an equipment controller 248. The output signal from the eddy current sensor 50 is sent to the endpoint detection controller 246. The endpoint detection controller 246 performs necessary processing (arithmetic processing and correction) on the output signal from the eddy current sensor 50 to generate a monitoring signal (film thickness data corrected by the endpoint detection controller 246), The equipment controller 248 controls components such as the top ring motor 114 and a motor for the polishing table 100 (not illustrated) on the basis of the corrected film thickness data.

Note that the operations according to the embodiments of the present invention are also achievable using the following software and/or system. For example, the system (polishing apparatus) includes a main controller (control unit) that controls the apparatus overall and a plurality of sub-controllers that respectively control the operations by each unit (driving unit, holding unit, eddy current sensor output signal processing circuit, endpoint detection controller). The main controller and the sub-controllers each include a CPU, memory; a recording medium, and software (a program) stored in the recording medium for causing each unit to operate. The method for processing an output signal from an eddy current sensor according to an embodiment of the present invention may also be executed by the software (program).

The foregoing describes exemplary embodiments of the present invention, but the embodiments described above are for facilitating the understanding of the present invention, and do not limit the present invention. The present invention may be modified and improved without departing from the scope of the invention, and any equivalents obtained through such modification and improvement are obviously included in the present invention. Furthermore, any combination, or omission of the components described in the claims and the specification is possible insofar as at least one or some of the issues described above can be addressed, or insofar as at least one or some of the effects are exhibited.

This application claims the benefit of priority under the Paris Convention for Japanese Patent Application No. 2019-226547 and Japanese Patent Application No. 2019-226549 filed on Dec. 16, 2019 at the Japan Patent Office. The entire disclosure of Japanese Patent Laid-Open No. 2011-23579, including specification, claims, drawings, and abstract, is incorporated by reference as a part of this specification.

REFERENCE SIGNS LIST 50 eddy current sensor
54, 290 output signal processing circuit
72, 860, 862 exciting coil
73, 864, 866 detecting coil
74, 868, 870 dummy coil
174 eddy current sensor assembly
178, 1781, 1.782 mixer circuit
184, 1841, 1842 low-pass fitter
216 digital signal processor
246, 248 endpoint detection, controller
252 noise reduction signal, first noise reduction signal, second noise reduction signal
256 noise-reduced signal, first noise-reduced signal, second noise-reduced signal
258 adder circuit
284 adder circuit, third adder circuit
292 first difference signal
294 second difference signal
1783 third mixer circuit
1784 fourth mixer circuit
1843 third low-pass filler
1844 fourth low-pass filter
1941 first adjustment circuit
1942 second adjustment circuit
1961 first subtracter circuit
2541, 2542 generator circuit
2581 first adder circuit
2582 second adder circuit
2801 first noise-reduced signal
2802 second noise-reduced signal

What is claimed is:

1. An eddy current sensor output signal processing circuit, that processes first and second output signals output by an eddy current sensor including first and second coils that respectively output the first and second output signals, the output signal processing circuit comprising:
   a first mixer circuit that accepts the first output signal and a signal of a predetermined frequency as input, multiplies the two input signals, and outputs an output signal obtained by the multiplication;
   a first low-pass filter that accepts the output signal output by the first mixer circuit as input, cuts a high-frequency signal included in the output signal received as input, and outputs at least a DC signal;
   a second mixer circuit that accepts the second output signal and the signal of the predetermined frequency as input, multiplies the two input signals, and outputs an output signal obtained by the multiplication;
   a second low-pass filter that accepts the output signal output by the second mixer circuit as input, cuts a high-frequency signal included in the output signal received as input, and outputs at least a DC signal; and
   a first subtractor circuit that accepts the DC signal output by the first low-pass filter and the DC signal output by the second low-pass filter as input, obtains a difference between the two input DC signals, and outputs the obtained difference,
wherein
   the eddy current sensor includes third and fourth coils that respectively output third and fourth output signals, and
   the output signal processing circuit includes
      a third mixer circuit that accepts the third output signal and the signal of the predetermined frequency as input, multiplies the two input signals, and outputs an output signal obtained by the multiplication,
      a third low-pass filter that accepts the output signal output by the third mixer circuit as input, cuts a high-frequency signal included in the output signal received as input, and outputs at least a DC signal,
      a fourth mixer circuit that accepts the fourth output signal and the signal of the predetermined frequency as input, multiplies the two input signals, and outputs an output signal obtained by the multiplication,
      a fourth low-pass filter that accepts the output signal output by the fourth mixer circuit as input, cuts a high-frequency signal included in the output signal received as input, and outputs at least a DC signal,
      a second subtractor circuit that accepts the DC signal output by the third low-pass filter and the DC signal output by the fourth low-pass filter as input, obtains a difference between the two input DC signals, and outputs the obtained difference, and
      an adder circuit that accepts the difference output by the first subtractor circuit and the difference output by the second subtractor circuit as input, obtains a sum of the two input differences or a difference between the two input differences, and outputs the obtained sum or difference.

2. The eddy current sensor output signal processing circuit according to claim 1, wherein
   the output signal processing circuit includes a first adjustment circuit that accepts the DC signal output by the first low-pass filter as input, adjusts a magnitude of an amplitude of the input DC signal, and outputs an adjusted DC signal, and
   the first subtractor circuit accepts the DC signal output by the first adjustment circuit and the DC signal output by the second low-pass filter as input, obtains a difference between the two input DC signals, and outputs the obtained difference.

3. The eddy current sensor output signal processing circuit according to claim 1, wherein
   the output signal processing circuit includes
      a first adjustment circuit that accepts the DC signal output by the first low-pass filter as input, adjusts a magnitude of an amplitude of the input DC signal, and outputs an adjusted DC signal, and
      a second adjustment circuit that accepts the DC signal output by the second low-pass filter as input, adjusts a magnitude of an amplitude of the input DC signal, and outputs an adjusted DC signal, and
   the first subtractor circuit accepts the DC signal output by the first adjustment circuit and the DC signal output by the second adjustment circuit as input, obtains a difference between the two input DC signals, and outputs the obtained difference.

4. A polishing apparatus comprising:
   a polishing table to which a polishing pad for polishing a substrate is attached;
   a driving unit configured to rotationally drive the polishing table;
   a holding unit configured to hold the substrate and press the substrate against the polishing pad;
   an eddy current sensor disposed inside the polishing table and configured to detect an eddy current formed in a conductive film formed on the substrate in association with the rotation of the polishing table;

an eddy current sensor output signal processing circuit that processes first and second output signals output by the eddy current sensor including first and second coils that respectively output the first and second output signals, the output signal processing circuit comprising:
a first mixer circuit that accepts the first output signal and a signal of a predetermined frequency as input, multiplies the two input signals, and outputs an output signal obtained by the multiplication;
a first low-pass filter that accepts the output signal output by the first mixer circuit as input, cuts a high-frequency signal included in the output signal received as input, and outputs at least a DC signal;
a second mixer circuit that accepts the second output signal and the signal of the predetermined frequency as input, multiplies the two input signals, and outputs an output signal obtained by the multiplication;
a second low-pass filter that accepts the output signal output by the second mixer circuit as input, cuts a high-frequency signal included in the output signal received as input, and outputs at least a DC signal; and
a first subtractor circuit that accepts the DC signal output by the first low-pass filter and the DC signal output by the second low-pass filter as input, obtains a difference between the two input DC signals, and outputs the obtained difference; and
an endpoint detection controller configured to compute film thickness data about the substrate from the output of the output signal processing circuit.

5. The polishing apparatus according to claim 4, wherein the output signal processing circuit includes a first adjustment circuit that accepts the DC signal output by the first low-pass filter as input, adjusts a magnitude of an amplitude of the input DC signal, and outputs an adjusted DC signal, and
the first subtractor circuit accepts the DC signal output by the first adjustment circuit and the DC signal output by the second low-pass filter as input, obtains a difference between the two input DC signals, and outputs the obtained difference.

6. The polishing apparatus according to claim 4, wherein the output signal processing circuit includes
a first adjustment circuit that accepts the DC signal output by the first low-pass filter as input, adjusts a magnitude of an amplitude of the input DC signal, and outputs an adjusted DC signal, and
a second adjustment circuit that accepts the DC signal output by the second low-pass filter as input, adjusts a magnitude of an amplitude of the input DC signal, and outputs an adjusted DC signal, and
the first subtractor circuit accepts the DC signal output by the first adjustment circuit and the DC signal output by the second adjustment circuit as input, obtains a difference between the two input DC signals, and outputs the obtained difference.

* * * * *